United States Patent [19]
Ahn

[11] Patent Number: 5,330,614
[45] Date of Patent: Jul. 19, 1994

[54] MANUFACTURING METHOD OF A CAPACITOR HAVING A STORAGE ELECTRODE WHOSE SIDEWALL IS POSITIVELY INCLINED WITH RESPECT TO THE HORIZONTAL SURFACE

[75] Inventor: Ji-hong Ahn, Seoul, Rep. of Korea

[73] Assignee: Samsung Electronics Co., Ltd., Suwon, Rep. of Korea

[21] Appl. No.: 917,182

[22] Filed: Jul. 22, 1992

[30] Foreign Application Priority Data

| Aug. 31, 1991 [KR] | Rep. of Korea | 91-15250 |
| Nov. 30, 1991 [KR] | Rep. of Korea | 91-21974 |
| Feb. 29, 1992 [KR] | Rep. of Korea | 92-3339 |

[51] Int. Cl.⁵ .................................. H01L 21/306
[52] U.S. Cl. ........................ 156/631; 437/60; 437/915
[58] Field of Search ............ 437/47, 60, 195, 915, 437/919, 978; 156/631, 632; 148/DIG. 14

[56] References Cited

U.S. PATENT DOCUMENTS

| 5,047,817 | 9/1991 | Wakamiya et al. | 257/534 |
| 5,084,405 | 1/1992 | Fazan et al. | 437/60 |
| 5,100,828 | 3/1992 | Fujii et al. | 437/60 |
| 5,164,337 | 11/1992 | Ogawa et al. | 437/978 |

FOREIGN PATENT DOCUMENTS

| 294840 | 12/1988 | European Pat. Off. . |
| 295709 | 12/1988 | European Pat. Off. . |
| 318277 | 5/1989 | European Pat. Off. . |
| 415530 | 3/1991 | European Pat. Off. . |
| 443439 | 8/1991 | European Pat. Off. . |
| 2242782 | 10/1991 | United Kingdom . |
| 2244597 | 12/1991 | United Kingdom . |
| 2250377 | 6/1992 | United Kingdom . |

OTHER PUBLICATIONS

Kakimoto et al., "A Stacked Capacitor Cell with Ring Structure", Extended Abstracts of the 22nd (1990 International) Conference on Solid State Devices and Materials, Sendai, 1990, pp. 833–836.

Primary Examiner—Brian E. Hearn
Assistant Examiner—C. Chaudhari
Attorney, Agent, or Firm—Cushman, Darby & Cushman

[57] ABSTRACT

Disclosed are a semiconductor memory device and method for manufacturing the same. The method includes a process for manufacturing a capacitor performed by the steps of forming a first conductive layer on a semiconductor substrate, forming a first pattern composed of a 1st first-material layer on the first conductive layer, forming a first sidewall spacer composed of 1st second-material layer on the resultant structure, and etching the material layer under the first sidewall spacer, using the first sidewall spacer as an etch-mask. The semiconductor memory device thus manufactured can be highly integrated and is highly reliable.

33 Claims, 29 Drawing Sheets

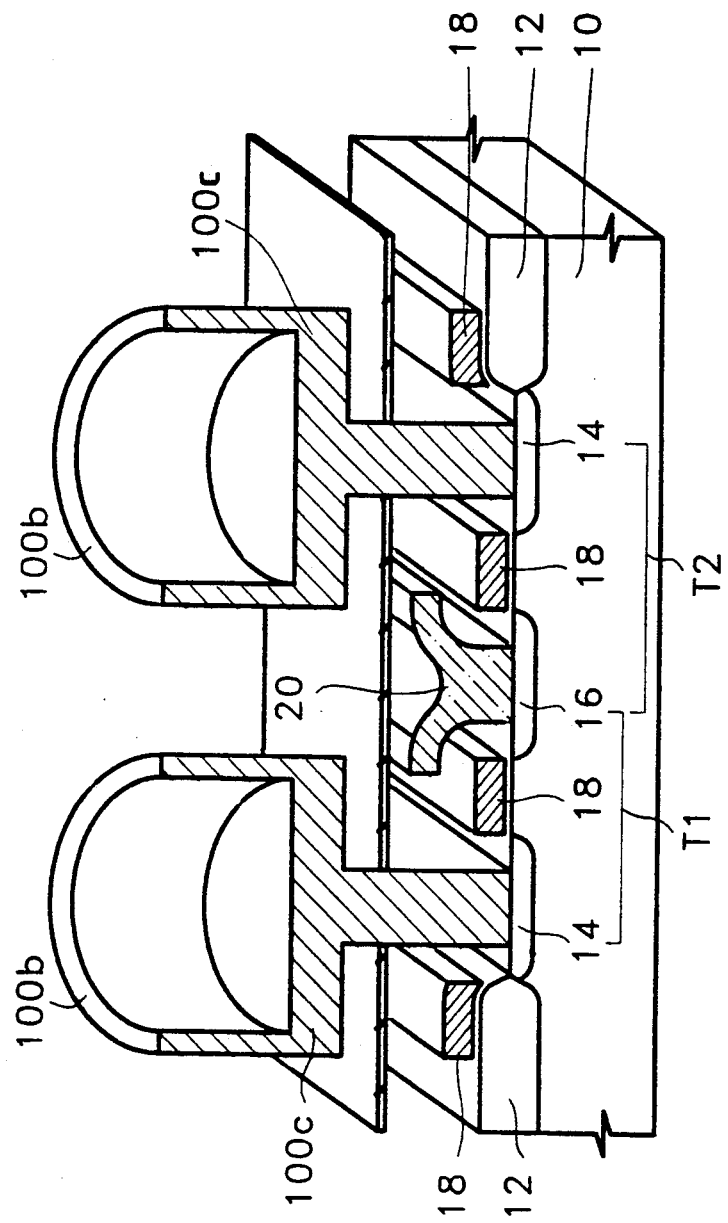

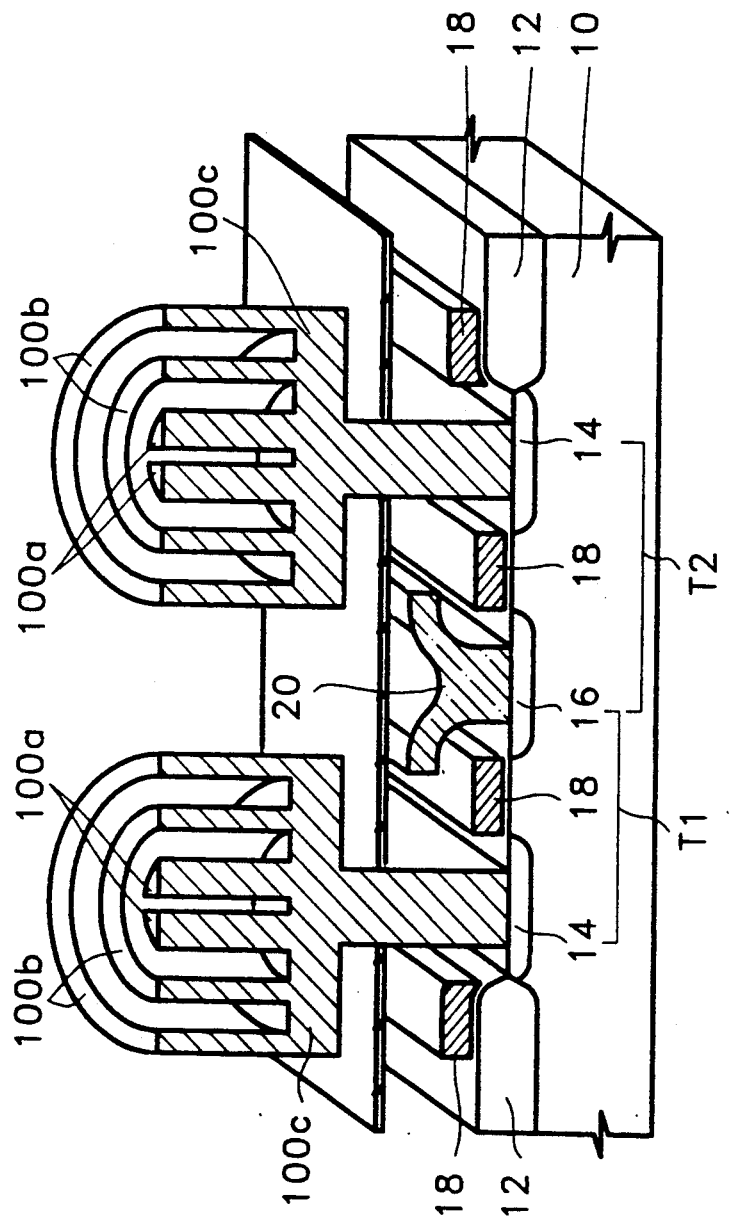

5,330,614

MANUFACTURING METHOD OF A CAPACITOR HAVING A STORAGE ELECTRODE WHOSE SIDEWALL IS POSITIVELY INCLINED WITH RESPECT TO THE HORIZONTAL SURFACE

BACKGROUND OF THE INVENTION

The present invention relates to a semiconductor device and a manufacturing method thereof, and particularly to a highly integrated semiconductor device having a capacitor with high reliability and large capacitance, and a method for manufacturing the same. The present invention relates to the present inventor's copending U.S. patent application Ser. No. 07/715,913, now U.S. Pat. No. 5,274,258 filed on Jun. 14, 1991.

Decrease in cell capacitance caused by reduced memory cell area becomes a serious obstruction to the increase of packing density in dynamic random access memories (DRAMs). Thus, the problem of decreased cell capacitance must be solved so as to achieve higher packing density in a semiconductor memory device, since it degrades read-out capability and increases the soft error rate of a memory cell as well as consumes excessive power during low-voltage operation by impeding device operation.

Generally, in a 64 Mbit DRAM having a 1.5 $\mu m^2$ memory cell area, when employing a two-dimensional stacked structure memory cell, sufficient cell capacitance cannot be obtained even though a higher dielectric constant material, e.g., tantalum oxide ($Ta_2O_5$) is used. Therefore, stacked capacitors having a three-dimensional structure have been suggested to improve cell capacitance. The double stack, fin, cylindrical electrode, spread stack, and box structures are all for a storage electrode having a three-dimensional structure proposed to increase cell capacitance.

Since both outer and inner surfaces can be utilized as an effective capacitor area, the cylindrical structure is favorably adopted to the three-dimensional stacked capacitor, and suitable for an integrated memory cell which is 64 Mb or higher. Also, an improved stacked capacitor with a ring structure has recently been presented, wherein a bar is formed in the interior of the cylinder, thereby utilizing not only both inner and outer surfaces of the cylinder but also the outer surface of the bar formed in the interior of the cylinder as the effective capacitor area ("A Stacked Capacitor Cell with Ring Structure," 22nd Conference on SSDN 1990, Part II, pp. 833–836).

FIGS. 1A through 1G are sectional views illustrating a process for forming a cylindrical storage electrode having a bar electrode therein.

An insulating inter layer 19 and a nitride layer 22 are sequentially stacked on a semiconductor substrate wherein a transistor having a source 14, a drain 16 and a gate electrode 18, and a buried bit line 20 in contact with the drain region of the transistor, have been formed (FIG. 1A). Then, the insulating inter-layer and nitride layer deposited on the source region are partially etched, thereby forming a contact hole 24 (FIG. 1B). Successively, a first polycrystalline silicon layer 26 having a predetermined thickness is formed on nitride layer 22, filling contact hole 24, and an oxide layer is stacked thereon and patterned to form a bar electrode within a cylinder, thereby forming an oxide layer pattern 28 (FIG. 1C). Thereafter, a predetermined depth of first polycrystalline silicon layer 26 is etched-back, using oxide layer pattern 28, so that a bar electrode 26a is formed, and an insulating layer with an etch selectivity different from that of oxide layer pattern 28 is formed on the first polycrystalline silicon layer. Then, the insulating layer is removed by an anisotropic etching. Here, portions of the insulating layer remain on the sidewalls of oxide layer pattern 28 and bar electrode 26a, thereby forming a spacer 30 (FIG. 1D). After coating a second polycrystalline silicon layer on the whole surface of the semiconductor substrate whereon oxide layer pattern 28, spacer 30, and bar electrode 26a are formed, the first and second polycrystalline silicon layers are anisotropically etched to form other spacers composed of the second polycrystalline silicon on the side of spacer 30, completing a cylindrical electrode 32 (FIG. 1E). Also, oxide layer pattern 28 and spacer 30 are removed by a wet etching, so that storage electrodes S1 and S2 formed of bar electrode 26b and cylindrical electrode 32 are completed (FIG. 1F).

Finally, a dielectric layer 34 is covered on the whole surface of the storage electrode, a third polycrystalline silicon is deposited on the whole surface of the semiconductor substrate, completing a stacked capacitor with a ring structure (FIG. 1G).

The above-described highly integrated semiconductor memory device has been adopted as a leading model which realizes 64 Mbit DRAM cells. That is because, a bar electrode is formed within the cylindrical electrode, so that the inner and outer surfaces of the cylindrical electrode as well as the outer surface of the bar electrode can be utilized as an effective capacitor region. However, the above memory device formed of the cylindrical and bar electrodes has a problem in that the cylindrical and bar electrodes are formed by different layers of a conductive material (not a single layer), which creates inconvenience in manufacturing. Besides, the cylindrical electrode is formed by an anisotropic etching of the second polycrystalline silicon layer, thereby forming double spacers on the sidewall of spacer 30, wherein the etched amount of the second polycrystalline silicon layer is inconsistent throughout the wafer, so that the height of cylindrical electrode 32 varies between its periphery and center, which can result in cells of different capacitances, even on the same wafer. Generally, if an etched object is a polycrystalline silicon, a storage electrode in the center of the wafer can be formed as shown the section view of FIG. 1H since the etch rates are different from each other in the periphery and center. Therefore, the obtained cell capacitance may be lower than the desired cell capacitance. In addition, due to forming cylindrical electrode 32 by an additional spacer on the sidewall of spacer 30, the top of the cylindrical electrode becomes sharp due to the double anisotropic etching, which is likely to cause breakdown of the dielectric layer coated thereon, and thus degrades the electrical characteristics, yield, and reliability of the device.

SUMMARY OF THE INVENTION

Accordingly, an object of the present invention is to provide a highly integrated semiconductor memory device having a storage electrode structure which is enough to satisfy the cell capacitance required for 64 Mbit DRAMs and higher, by solving several problems of the above-described conventional technique.

Another object of the present invention is to provide a highly integrated semiconductor memory device with reliability.

Still another object of the present invention is to provide a manufacturing method suitable for the highly integrated semiconductor memory device.

To achieve the above and other objects of the present invention, there is provided a semiconductor memory device comprising a capacitor having a storage electrode whose sidewall is positively inclined with respect to the horizontal surface.

To achieve another object of the present invention, there is provided a method for manufacturing a semiconductor memory device comprising the steps of:

forming a first conductive layer on a semiconductor substrate;

forming a first pattern composed of a 1st first-material layer on the first conductive layer;

forming a first sidewall spacer composed of 1st second-material layer on the resultant structure; and etching the material layer under the first sidewall spacer, using the first sidewall spacer as an etch-mask.

BRIEF DESCRIPTION OF THE DRAWINGS

The above objects and other advantages of the present invention will become more apparent by describing in detail the preferred embodiment of the present invention with reference to the accompanying drawings in which:

FIGS. 2A through 2C are perspective views showing semiconductor memory devices manufactured by embodiments of the present invention;

DETAILED DESCRIPTION OF THE INVENTION

Figure 1A:
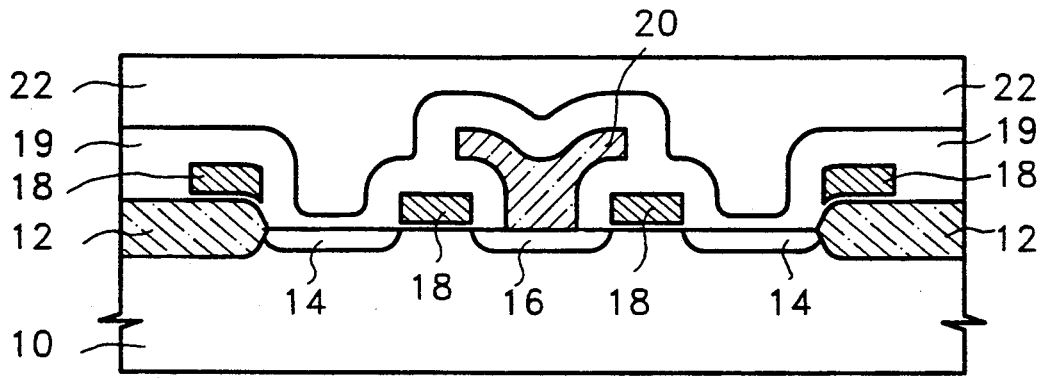
FIGS. 1A through 1G are sectional views showing a conventional method for manufacturing a semiconductor memory device.
Figure 1B:
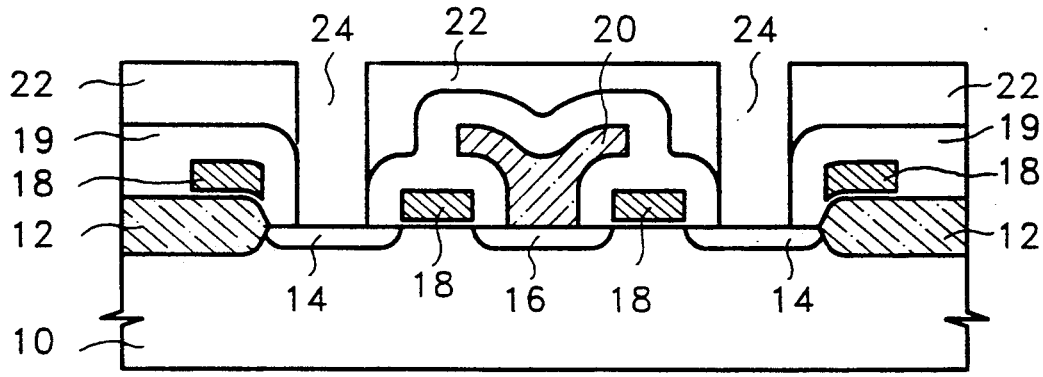
Figure 1C:
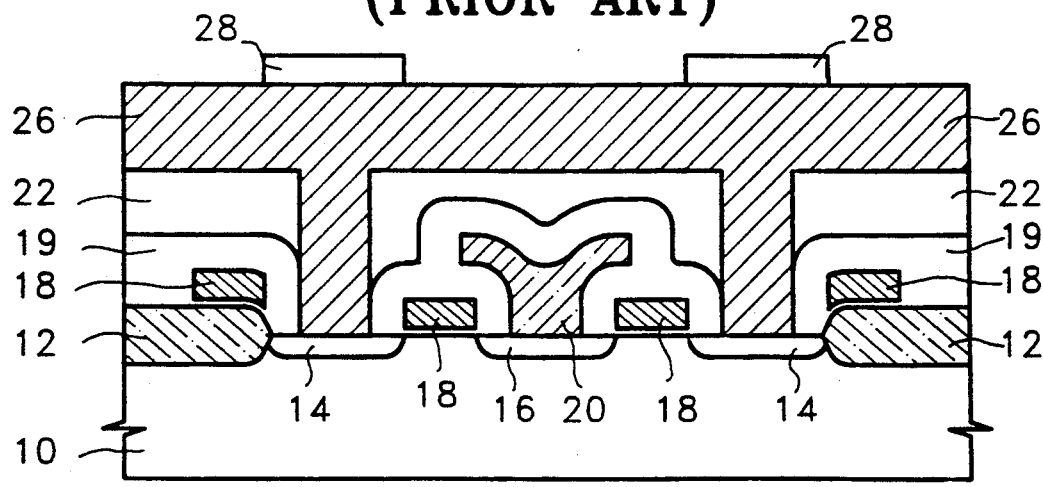
Figure 1D:
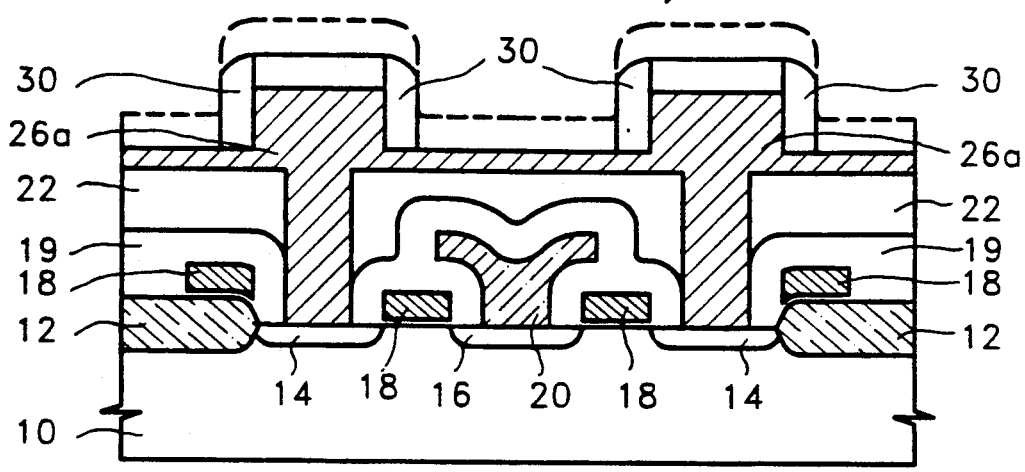
Figure 1E:
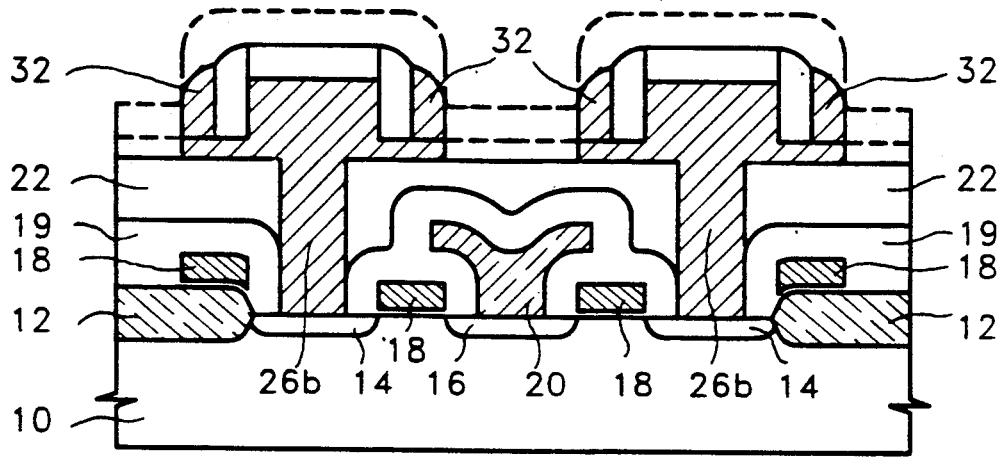
Figure 1F:
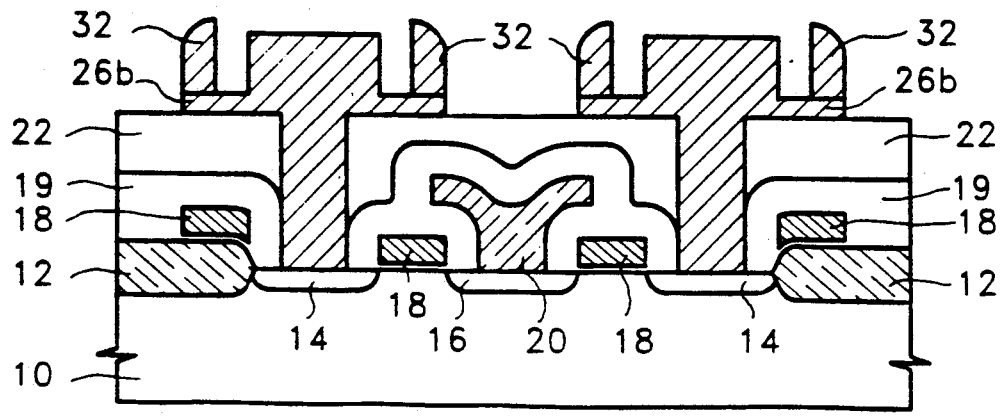
Figure 1G:
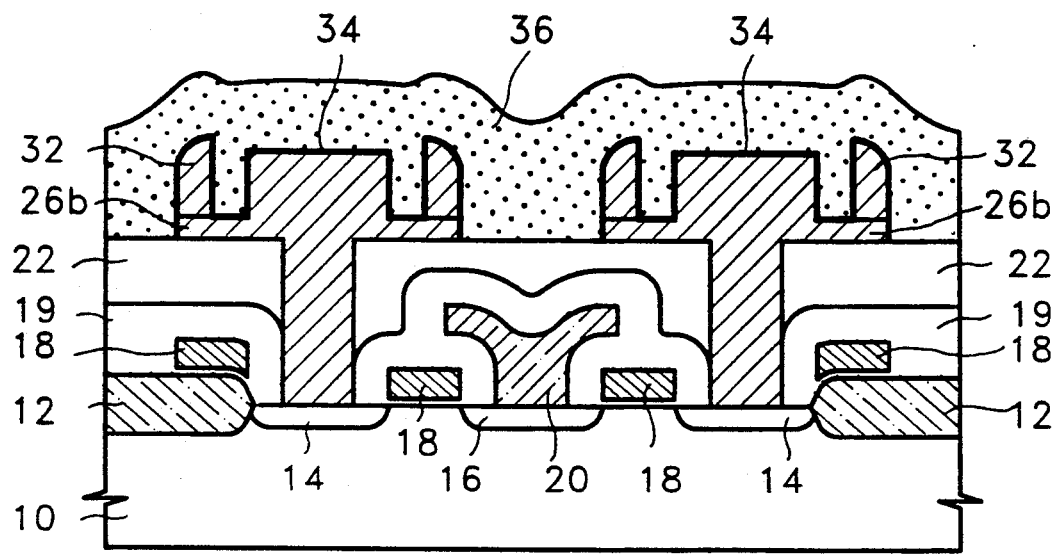
Figure 1H:
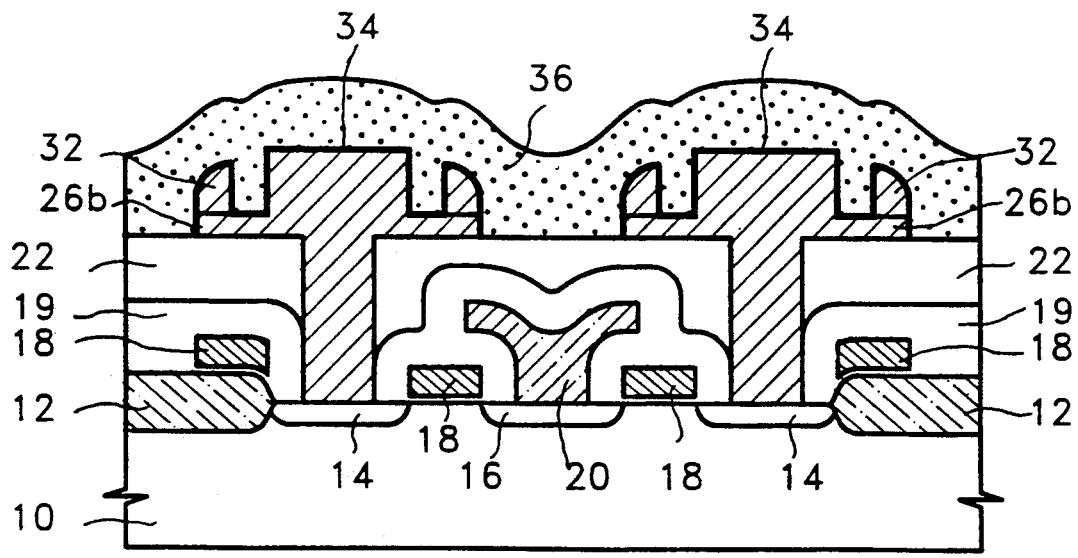
FIG. 1H is a sectional view showing the result when an etching is performed unevenly throughout a wafer in the semiconductor memory device manufactured by the method illustrated in FIGS. 1A through 1G.
Figure 2B:
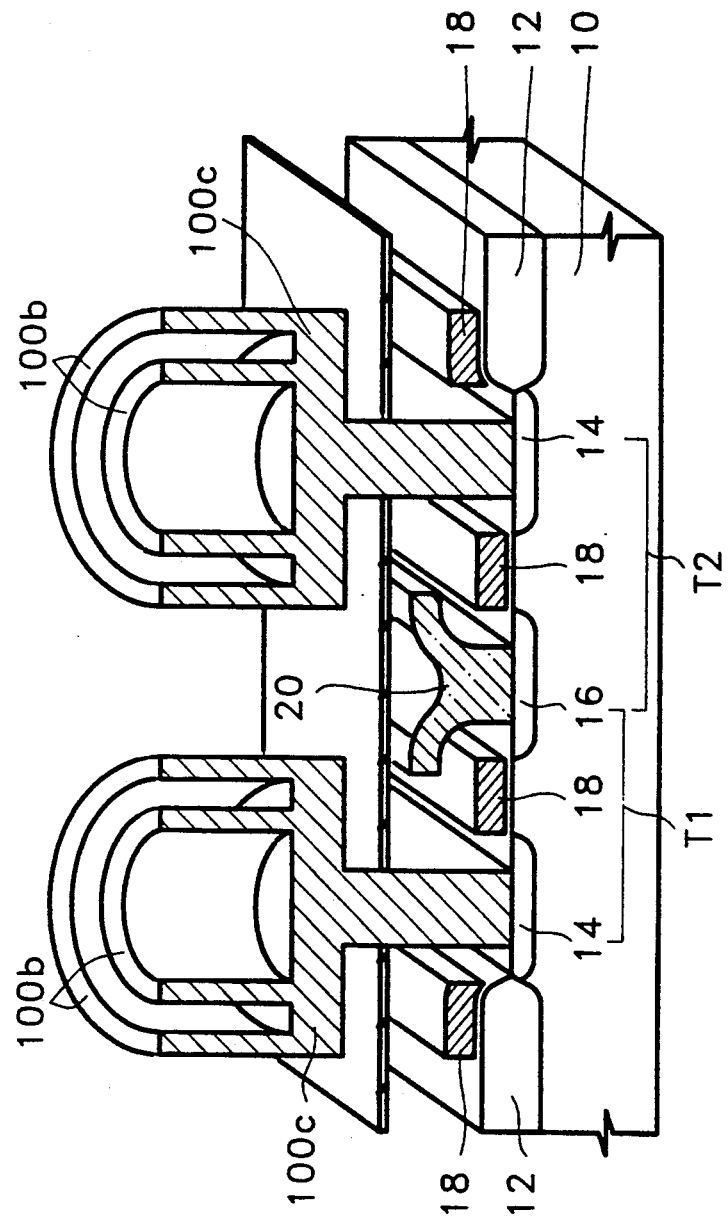

FIGS. 2A through 2C are perspective views showing semiconductor memory devices formed by embodiments of the present invention. Here, FIG. 2A illustrates a single-cylinder structure storage electrode without bar wherein one cylindrical electrode 100b and base electrode 100c are formed. FIG. 2B illustrates a multi-cylinder structure storage electrode without bar wherein a plurality of cylindrical electrodes 100b are concentrically formed, and connected to one another by a base electrode 100c. FIG. 2C illustrates a multi-cylinder multi-bar structure storage electrode wherein a plurality of cylindrical electrodes 100b are concentrically formed, and a plurality of bar electrodes 100a are formed in the interior of the cylindrical electrodes, all being connected by one base electrode 100c.

Each of the above-described storage electrode embodiments comprises a cylindrical electrode 100a, a bar electrode 100b, and a base electrode 100c, and is classified in accordance with the number of respective cylindrical and bar electrodes. Here, the sidewalls of the storage electrode are inclined so as not to be negative ($\theta < 90°$) with respect to the horizontal surface, with the bottom of the base electrode also being utilized as an effective area for cell capacitance.

Accordingly, since the surface area of storage electrodes S1 and S2 which are capable of storing a charge is enlarged by the inner and outer surfaces of cylindrical electrode 100a and outer surface of bar electrode 100b within a limited memory cell region, the desired cell capacitance can be obtained by adjusting the height and number of the cylindrical and bar electrodes. In addition, the obtained profile has no sharp fence formed along the inner walls of the cylindrical electrode.

FIGS. 3A through 3E are sectional views showing one embodiment of a method for manufacturing a semiconductor memory device according to the present invention.

Figure 3A:
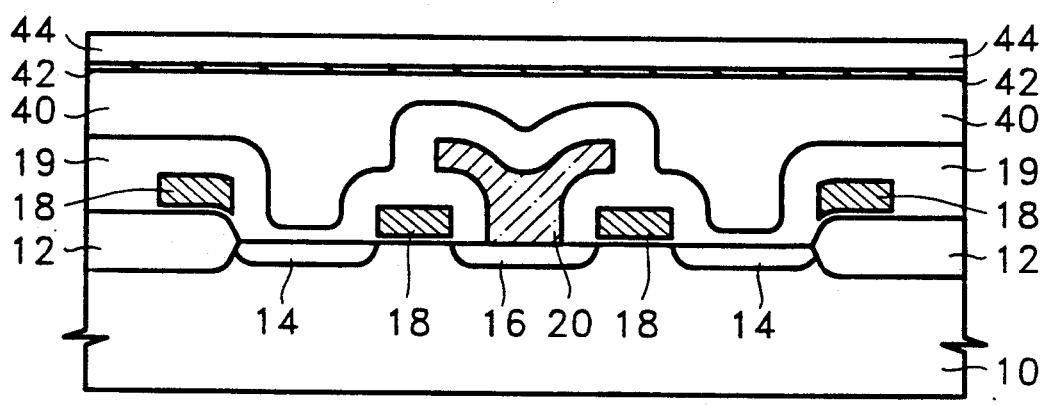
FIGS. 3A through 3E are sectional views showing a first embodiment of a method for manufacturing a semiconductor memory device according to the present invention.

To begin with, FIG. 3A illustrates a process for sequentially stacking a planarizing layer 40, an etch-blocking layer 42, and a spacer layer 44 on a semiconductor substrate whereon a transistor has been formed. This process is carried out as below. First, a pair of transistors each having a source region 14 and a gate electrode 18, commonly sharing a drain region 16 and a bit line 20 in contact with the drain region 16 are formed on an active region of a semiconductor substrate 10 divided into active and isolating regions by a field oxide layer 12. Then, insulating layer 19 is formed for insulating the transistor on the whole surface of the semiconductor substrate. Thereafter, planarizing layer 40 is formed on the whole surface of the resultant structure for planarizing the surface of the semiconductor substrate whose surface becomes stepped by the transistor formation step. A material such as a silicon nitride ($Si_3N_4$) is coated as an etch-blocking layer 42 to a thickness of 30Å–300Å. Lastly, a spacer layer 44 is formed by covering a material such as an oxide to a thickness of 500Å–2,000Å.

At this time, the etch rate of the material constituting etch-blocking layer 42 has to be different from that of the material constituting spacer layer 44 with respect to a wet etching to remove the spacer layer. (For example, when the etch rate of a "B" material is over 4 providing that the etch rate of an "A" material is set to 1, it can be expressed that the "A" material has a different etch rate from that of the "B" material with respect to any etching.) Generally, the material constituting the etch-blocking layer should have a much lower etch rate than the material constituting the spacer layer. In the present invention, the material constituting etch-blocking layer 42 is a silicon nitride, and that constituting spacer layer 44 is an oxide, as described above.

Figure 3B:
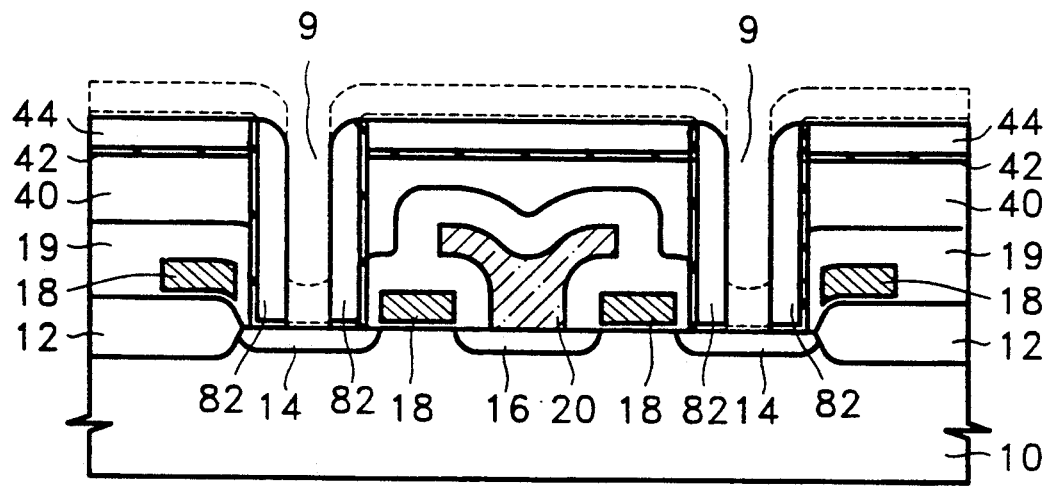

FIG. 3B illustrates a process for forming a contact hole 9 which partially exposes the source region of a transistor. Here, a first step for forming the contact hole is carried out by partially removing insulating layer 19, planarizing layer 40, etch-blocking layer 42, and spacer layer 44 which are sequentially stacked on the source region. Also, a second step is carried out such that the same material as that constituting the etch-blocking layer, i.e., silicon nitride, and the same material as that constituting the spacer layer, i.e., oxide, are sequentially stacked on the whole surface of the semiconductor substrate having the contact hole; and a spacer 82 is formed on the sidewalls of the contact hole by anisotropically etching the resultant structure.

The trend toward the miniaturization of transistors increases the possibility of partial exposure of the surface of gate electrode 18 or bit line 20 by the etching process for forming the contact hole, despite making the contact hole on the transistor formed in minimum feature size, which thus causes leakage current in the memory cell, especially in a DRAM cell. According to the second step, the cause of the leakage current can be eliminated by insulating the gate electrode or bit line whose surfaces may be partially exposed due to the etching process for forming the contact hole.

Figure 3C:
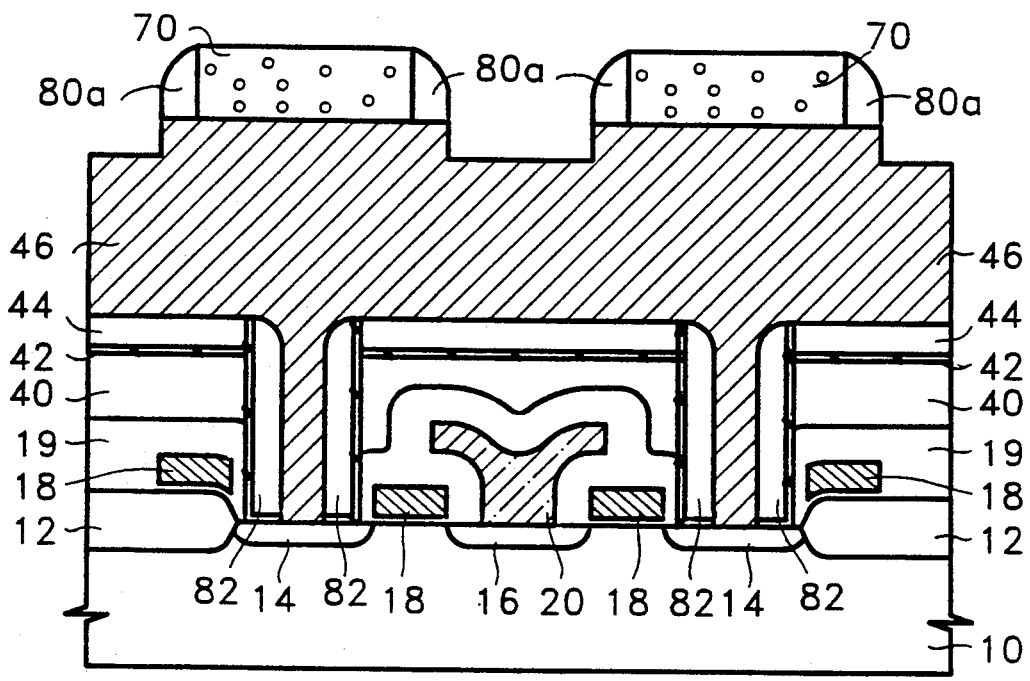

FIG. 3C illustrates a process for forming a first conductive layer 46, a first pattern 70 consisting of a 1st first-material layer, and a first sidewall spacer 80a consisting of a 1st second-material layer, and etching a predetermined depth of the first conductive layer using the first pattern and first sidewall spacer as an etch mask. This process is carried out as follows. First conductive layer 46 is formed by depositing a conductive material, e.g., 3,000Å–6,000Å of polycrystalline silicon doped with an impurity, on the whole surface of the resultant structure with the contact hole. A 1st first-material layer is formed by coating a material, e.g., 1,000Å–3,000Å of a photoresist, oxide or nitride, whose etch rate is different from those of the first conductive layer and a 1st second-material (which will be formed later) with respect to any etching. Then, first pattern 70 consisting of the 1st first-material layer is formed by defining the 1st first-material layer into an individual cell unit via a photolithography process to the 1st first-material. Thereafter, the 1st second-material layer is formed by coating a material about 500Å–1,500Å thick and having a different etch rate from that of the material constituting the first conductive layer with respect to any anisotropic etching. In other words, if the photoresist is employed as the material constituting the first pattern, an oxide which can be subjected to a low pressure deposition is used. In the same manner, if the oxide is employed first, nitride is used, and if the nitride comes first, oxide is used. Successively, first sidewall spacer 80a consisting of the 1st second-material layer is formed on the sidewall of the first pattern by anisotropically etching the 1st second-material layer. Then, a predetermined depth, e.g., about 500Å–1,500Å, of the first conductive layer is etched by carrying out anisotropic etching on the whole surface of the resultant structure, using the first pattern and first spacer as etch-masks.

Figure 3D:
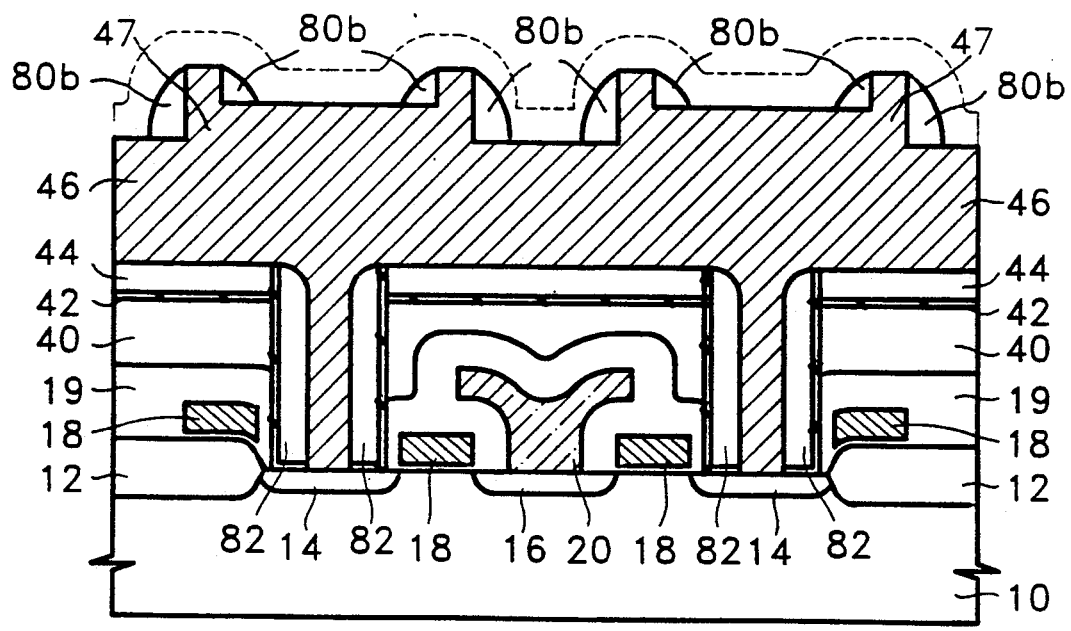

FIG. 3D illustrates a process for forming a first storage electrode pattern 47 and a second sidewall spacer 80b. Here, the first pattern is removed, and first storage electrode pattern 47 is formed on the first conductive layer by anisotropically etching the first conductive layer to the depth of about 1,500Å, using the first sidewall spacer as an etch-mask. After that, a material having a different etch rate from that of the material constituting the first conductive layer with respect to any anisotropic etching e.g. about 500Å–1,500Å of an oxide or nitride, is coated on the whole surface of the resultant structure. Then, the coated oxide or nitride is anisotropically etched, thereby forming second sidewall spacer 80b on the sidewall of the first storage electrode pattern.

At this time, the step for removing the materials constituting the first pattern and first sidewall spacer proceeds by an etchant suitable for the removed material. For example, an ashing technique is used when the eliminated material is the photoresist, a buffered oxide etchant (B.O.E.: a solution of HF and $NH_4F$ mixed in a proper ratio) is used for oxide, or a phosphoric acid solution is used for nitride.

Figure 3E:
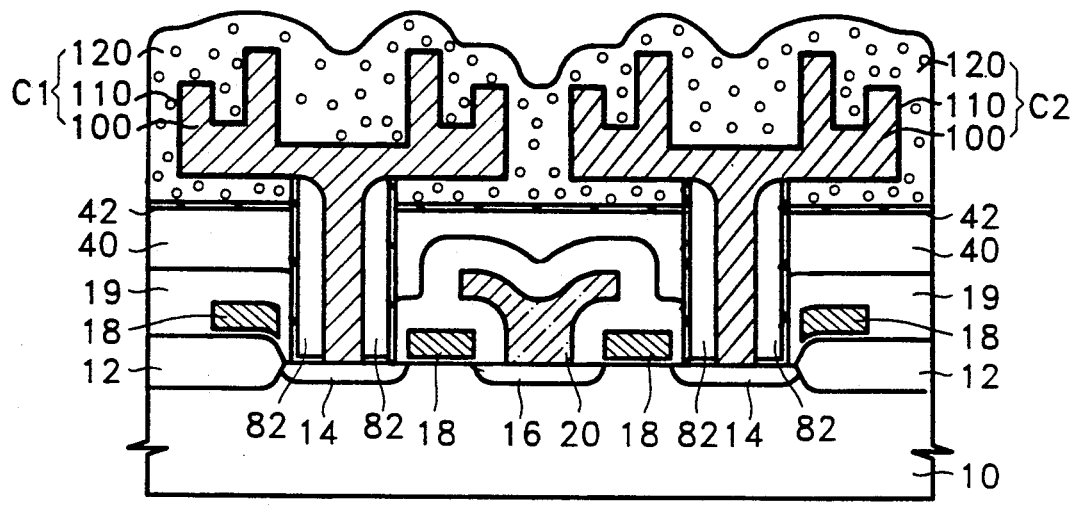

FIG. 3E illustrates a process for forming a storage electrode 100, a dielectric layer 110, and a plate electrode 120. First, storage electrode 100 is formed by anisotropic etching of the first conductive layer until reaching the surface of the spacer layer, using the second sidewall spacer as an etch-mask. Then, after removing the second sidewall spacer and the spacer layer, a dielectric material, e.g., an ONO (oxide/nitride/oxide) layer or $Ta_2O_5$ having a thickness of about 60Å, is coated on the whole surface of the storage electrode, thereby forming dielectric layer 110. Thereafter, plate electrode 120 is formed by depositing a conductive material such as an impurity-doped polycrystalline silicon on the whole surface of the resultant structure.

According to the above first embodiment, since the storage electrode is formed by a single conductive layer, leakage current caused by inter-layer foreign matter, such as a natural oxide layer, can be prevented. Also, the number of cylindrical electrodes can be doubled (multi-cylinder non-bar structure), easily increasing cell capacitance.

Figure 4A:
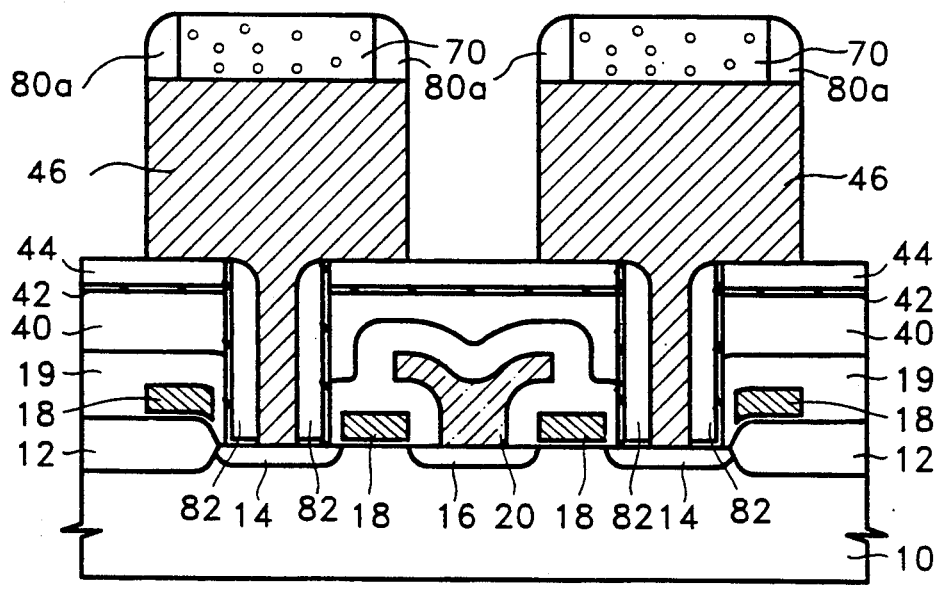
FIGS. 4A and 4B are sectional views showing a second embodiment of a method for manufacturing a semiconductor memory device according to the present invention.
Figure 4B:
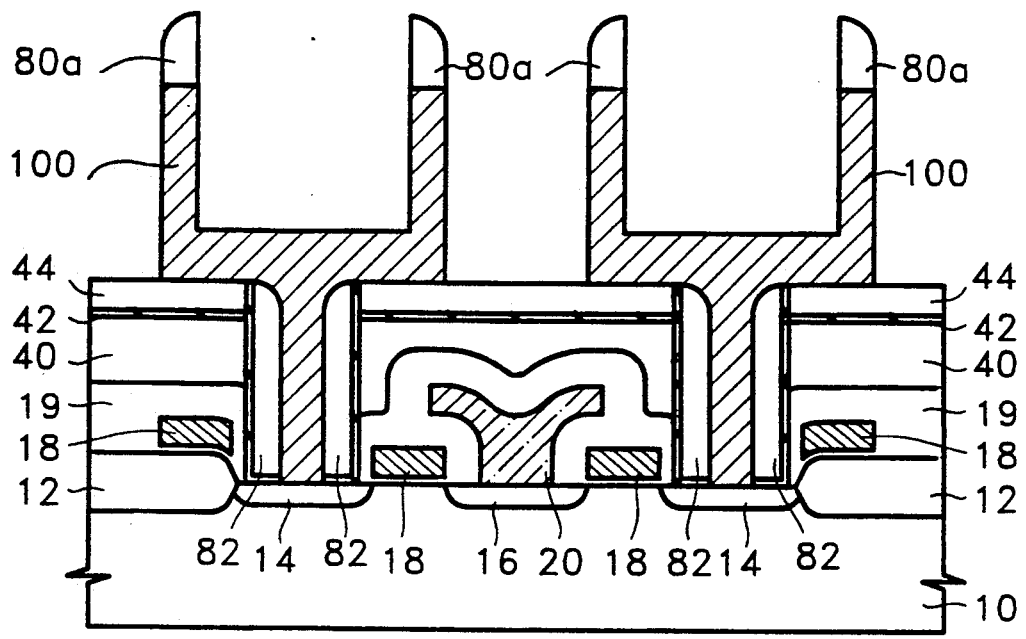

FIGS. 4A and 4B are sectional views showing a second embodiment of a method for manufacturing a semiconductor memory device according to the present invention. After forming first pattern 70 and first sidewall spacer 80a by the method described with reference to FIGS. 3A, 3B and 3C, the first conductive layer is defined into individual cell units by anisotropically etching the whole surface of the resultant structure until reaching spacer layer 44, using the first pattern and first sidewall spacer 80a as etch-masks (FIG. 4A). Thereafter, the first pattern is removed, and a storage electrode 100 is formed by anisotropically etching the first conductive layer to a predetermined depth, e.g, 2,000Å–5,000Å, using first sidewall spacer 80a (FIG. 4B).

According to above second embodiment, a single cylindrical electrode (single-cylinder non-bar structure) can be formed by a simple process.

FIGS. 5A through 5E are sectional views showing a third embodiment of a method for manufacturing a semiconductor memory device according to the present invention.

Figure 5A:
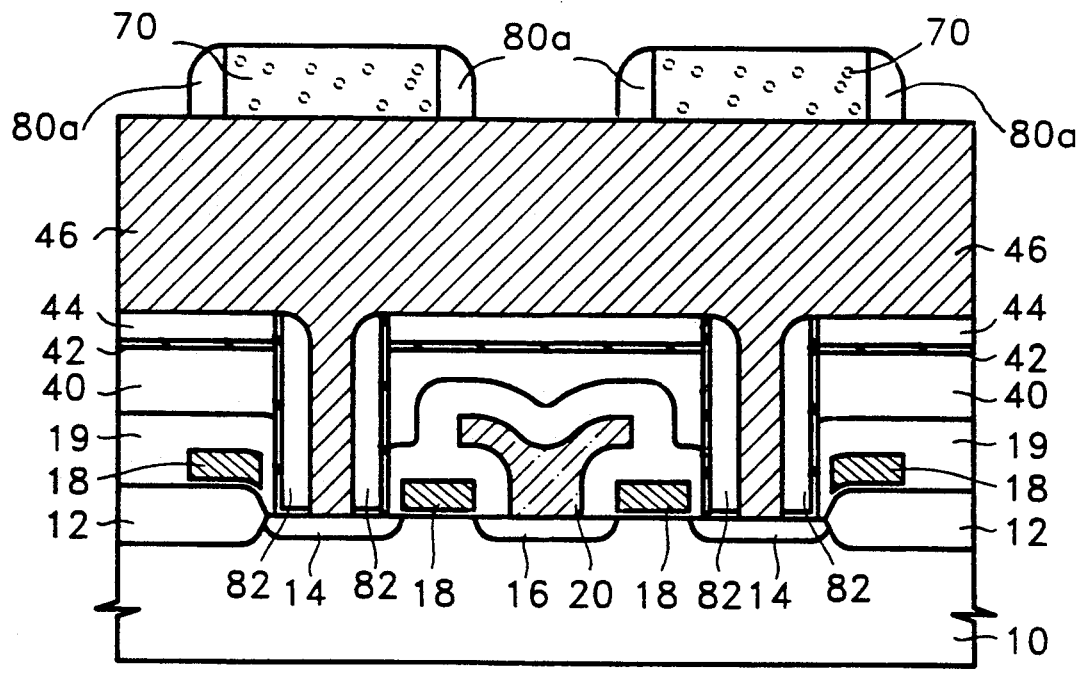
FIGS. 5A through 5E are sectional views showing a third embodiment of a method for manufacturing a semiconductor memory device according to the present invention.

FIG. 5A is a sectional view showing the formation of first pattern 70 consisting of the 1st first-material layer 15 and first sidewall spacer 80a on first conductive layer 46, also by the method described with reference to FIGS. 3A, 3B and 3C.

Figure 5B:
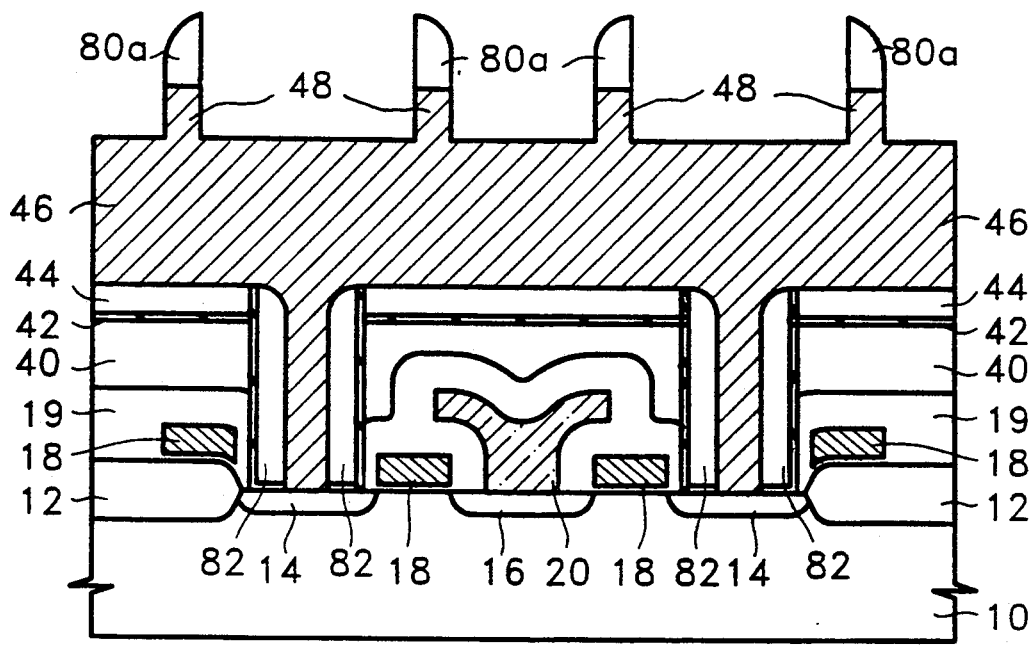

FIG. 5B illustrates the step of forming a second storage electrode 48 on the first conductive layer, which comprises steps of removing the first pattern, and forming second storage electrode 48 by etching a predetermined depth of the first conductive layer, using first sidewall spacer 80a an etch-mask. Preferably, the predetermined depth is approximately 500Å–1,500Å.

Figure 5C:
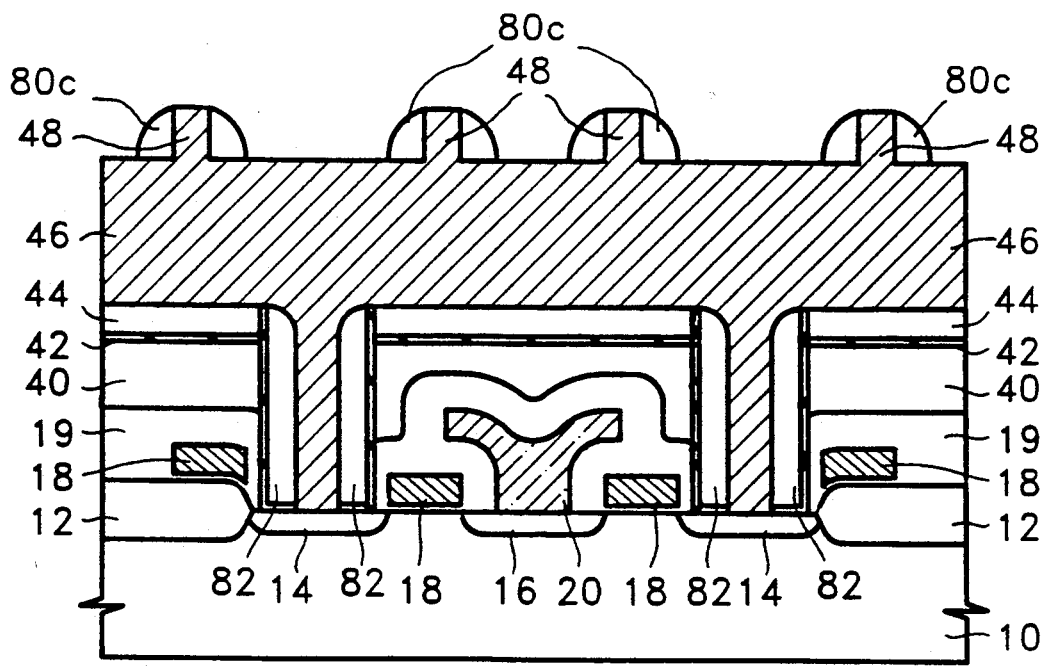

FIG. 5C illustrates the step of forming a third sidewall spacer 80c on the sidewall of the second storage electrode. Here, the first sidewall spacer is removed, and a material having an etch rate different from that of the material constituting the first conductive layer with respect to any anisotropic etching, e.g., an oxide or nitride, is coated on the whole surface of the resultant structure to a thickness of about 500Å–1,500Å. Then, the coated oxide or nitride is anisotropically etched, thereby forming third sidewall spacer 80c.

Figure 5D:
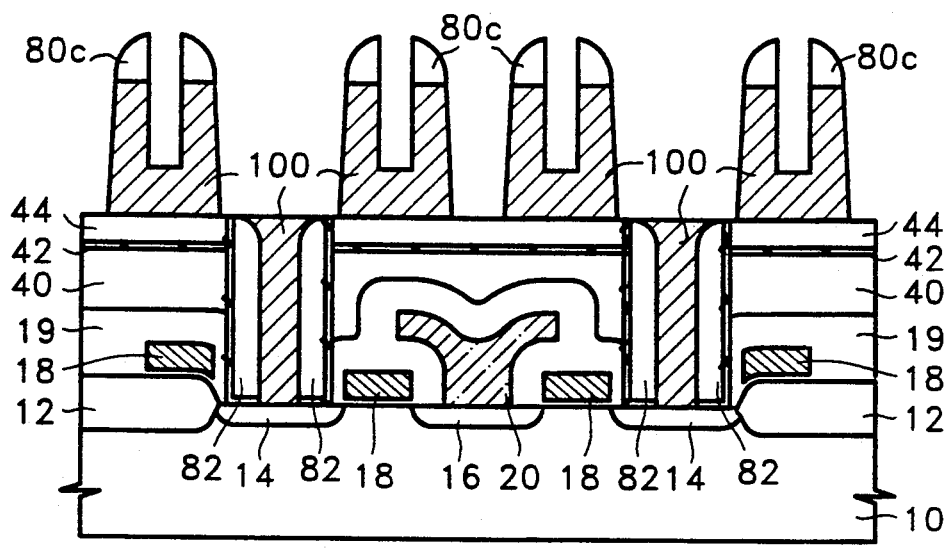

FIG. 5D illustrates the step of forming storage electrode 100, wherein the storage electrode is completed by carrying out anisotropic etching of the first conductive layer over the whole surface of the structure until reaching spacer layer 44, using third sidewall spacer 80c as an etch-mask.

Figure 5E:
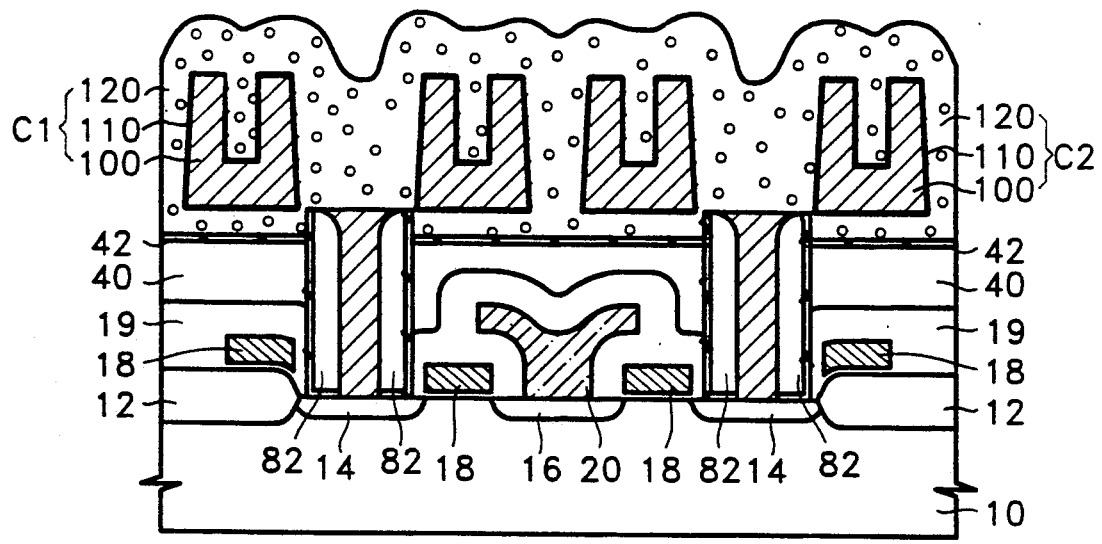

FIG. 5E illustrates the step of forming a dielectric layer 110 and a plate electrode 120. First, the third sidewall spacer and spacer layer are removed, Then, dielectric layer 110 is formed by covering a dielectric material, e.g, an ONO layer, on the whole surface of the storage electrode. Plate electrode 120 is formed by depositing a conductive material such as a polycrystalline silicon doped with an impurity on the whole surface of the resultant structure.

According to the third embodiment of the present invention, a storage electrode having a double cylindrical electrode (multi-cylinder non-bar structure) can be formed.

Figure 6A:
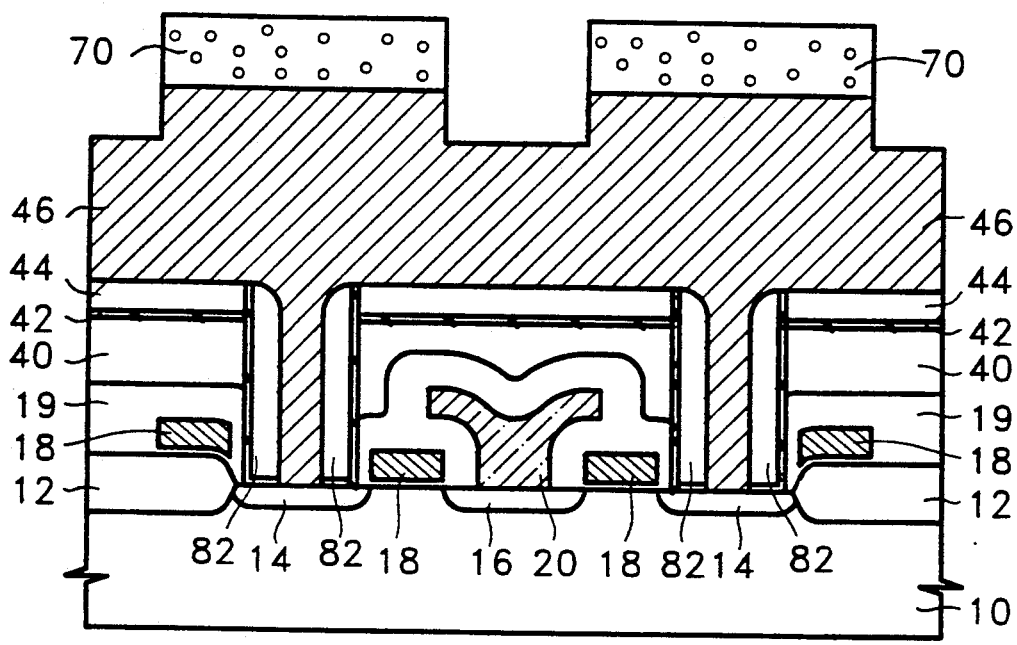
FIGS. 6A through 6C are sectional views showing a fourth embodiment of a method for manufacturing a semiconductor memory device according to the present invention.
Figure 6B:
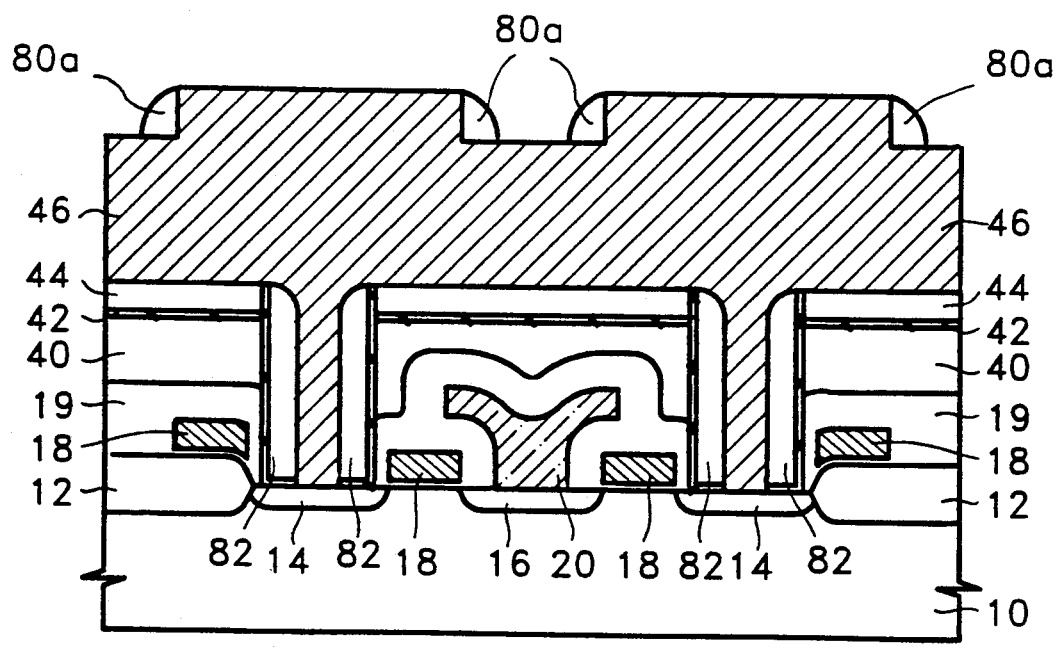
Figure 6C:
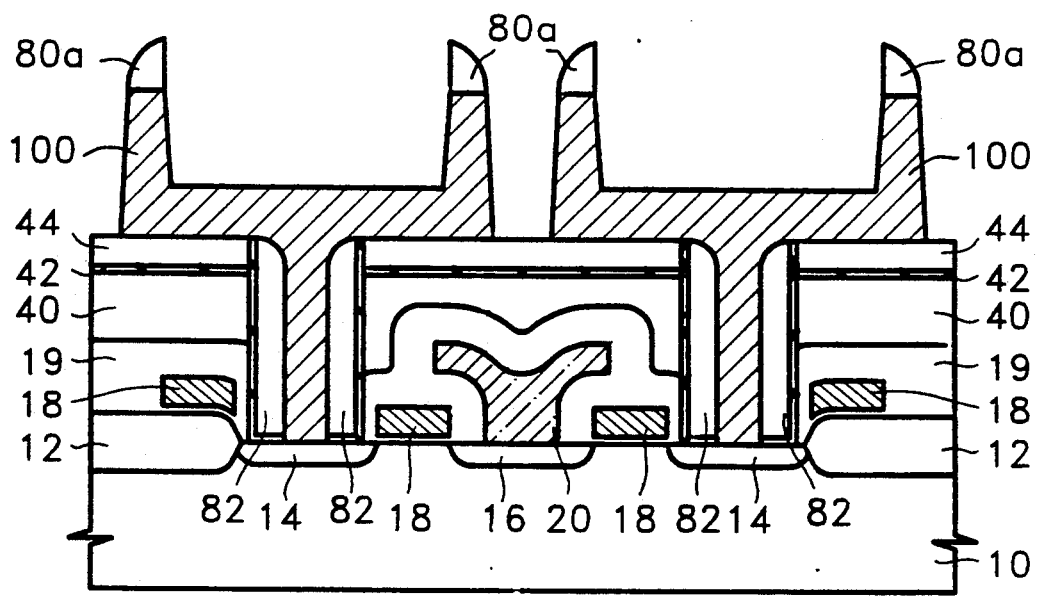

FIGS. 6A, 6B and 6C are sectional views showing a fourth embodiment of a method for manufacturing a semiconductor memory device according to the present invention. Here, after forming first pattern 70 on the first conductive layer (which has already been described with reference to FIG. 3C), the first conductive layer is etched to be a predetermined depth, e.g., about 1500Å, using the first pattern as an etch-mask (FIG. 6A). Then, the first pattern is removed, first sidewall spacer 80a is formed on the resultant structure (which has already been described with reference to FIG. 3C), and storage electrode 100 (one cylinder-non bar structure) is formed by performing anisotropic etching over the whole surface of the resultant structure until reaching spacer layer 44, using the first sidewall spacer as an etch-mask (FIG. 6C).

Figure 7A:
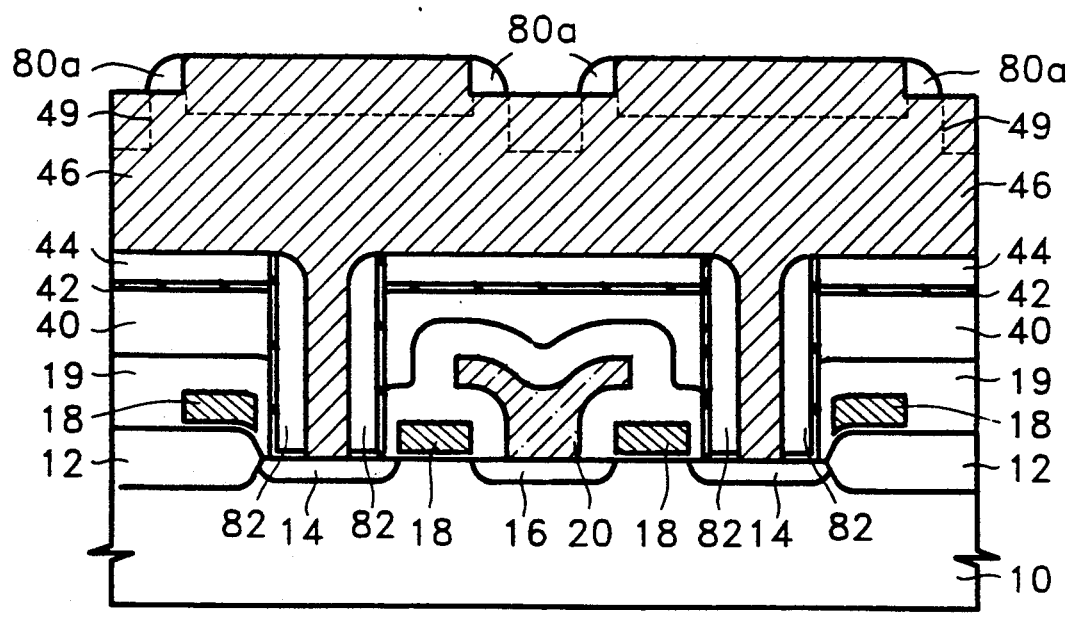
FIGS. 7A through 7C are sectional views showing a fifth embodiment of a method for manufacturing a semiconductor memory device according to the present invention.
Figure 7B:
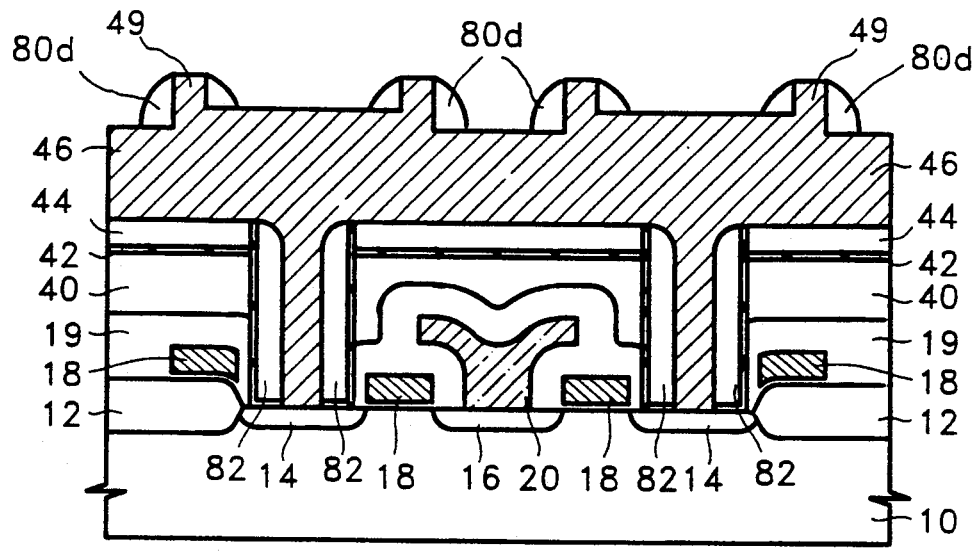
Figure 7C:
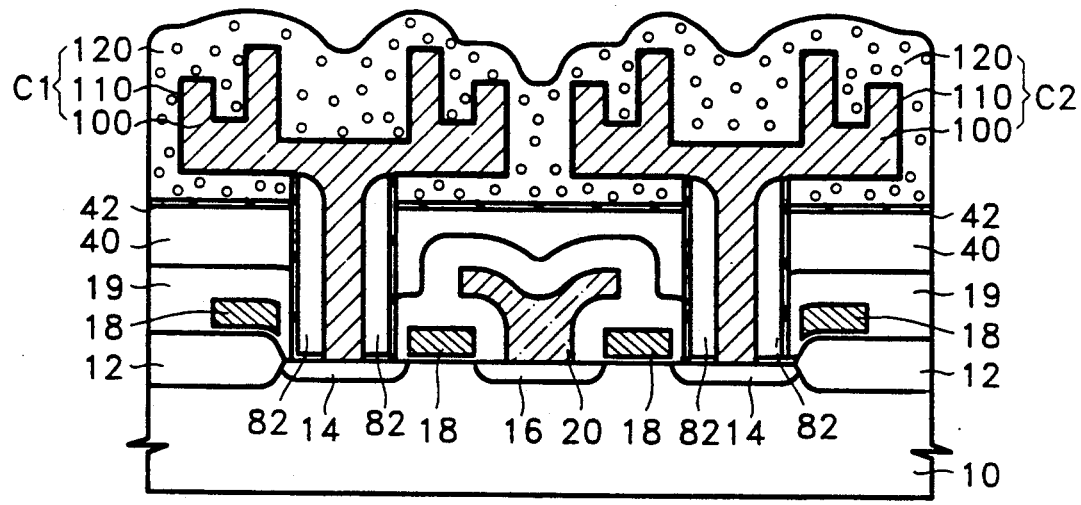

FIGS. 7A, 7B and 7C are sectional views showing an fifth embodiment of a method for manufacturing a semiconductor memory device according to the present invention. Here, the first sidewall spacer is formed in accordance with the method described with reference to FIGS. 6A and 6B (FIG. 7A). Then, after a third storage electrode pattern 49 is formed by etching a predetermined depth of the first conductive layer using the first sidewall spacer as an etch-mask, a material having an etch rate different from that of the material constituting the first conductive layer with an anisotropic etching, e.g, an oxide or nitride, is coated on the whole surface of the resultant structure, and then anisotropically etched, so that a fourth sidewall spacer 80d is formed on the sidewall of the third storage electrode pattern (FIG. 7B). Successively, storage electrode 100 is formed by performing anisotropic etching on the whole surface of the resultant structure until reaching spacer layer 44, using the fourth sidewall spacer as an etch-mask. Thereafter, the fourth sidewall spacer and spacer layer are removed, and dielectric layer 110 is formed by coating a dielectric layer such as an ONO layer on the whole surface of the storage electrode. Finally, plate electrode 120 is formed by depositing a conductive material, such as a polycrystalline silicon doped with an impurity, on the whole surface of the resultant structure.

According to the fifth embodiment, a storage electrode having a double cylindrical electrode (multi-cylinder non-bar structure) can be formed.

Figure 8:
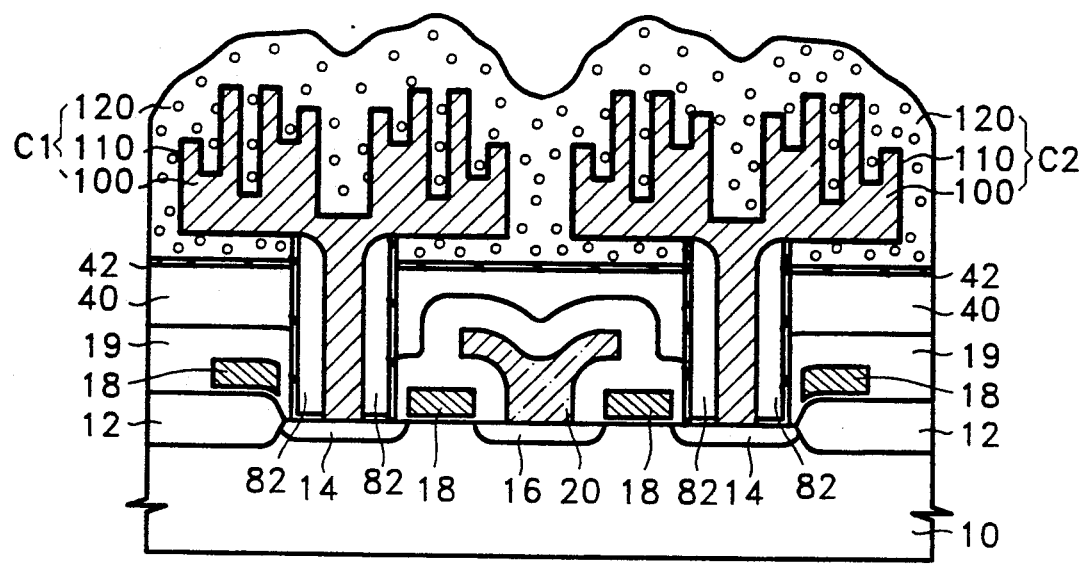
FIG. 8 is a sectional view showing a sixth embodiment of a method for manufacturing a semiconductor memory device according to the present invention.

FIG. 8 illustrates a semiconductor memory device formed by a sixth embodiment of a manufacturing method according to the present invention. After performing the process described with reference to FIGS. 7A and 7B, a predetermined depth of the first conductive layer is etched using the fourth sidewall spacer as an etch-mask, thereby forming a fourth storage electrode pattern (not shown). Then, the fourth sidewall spacer is removed, and a fifth sidewall spacer (not shown) is formed on the sidewall of the fourth storage electrode pattern. Thereafter, storage electrode 100 is formed by performing an anisotropic etching on the whole surface of the resultant structure until reaching the spacer layer, using the fifth sidewall spacer as an etch-mask. Finally, dielectric layer 110 is formed on the whole surface of the storage electrode, and plate electrode 120 is formed on the whole surface of the dielectric layer.

According to above sixth embodiment, a storage electrode with quadruple cylindrical electrodes (multi-cylinder non-bar structure) can be formed.

FIGS. 9A through 9D are sectional views showing a seventh embodiment of a method for manufacturing a semiconductor memory device according to the present invention.

Figure 9A:
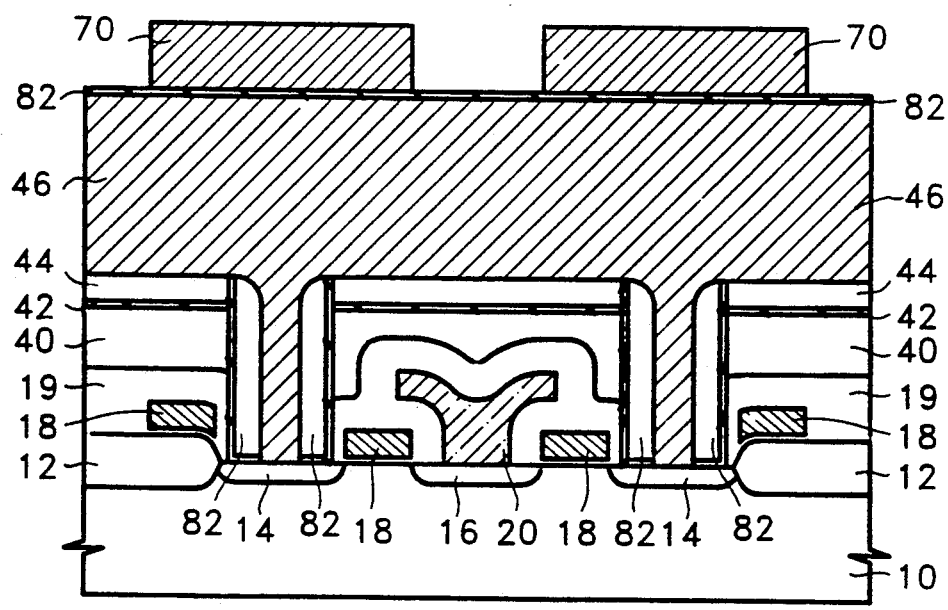
FIGS. 9A through 9D are sectional views showing a seventh embodiment of a method for manufacturing a semiconductor memory device according to the present invention.

FIG. 9A illustrates the step of forming a 2nd second-material layer 82 and a first pattern 70 on the first conductive layer. Here, after forming first conductive layer 46 by the method described with reference to FIGS. 3A to 3C, a material having an etch rate different from that of the material constituting the first conductive layer with respect to any anisotropic etching, e.g., oxide or nitride, is coated on the whole surface of the resultant structure to have a thickness of about 100Å–300Å, thereby forming a 2nd second-material layer 82. Then, a material having the same or a similar etch rate as that of the material constituting the first conductive layer with respect to any anisotropic etching, e.g., a polycrystalline silicon whose thickness is about 1,000Å–3,000Å, is deposited on the whole surface of the resultant structure, so that a 1st first-material layer is formed. Then the 1st first-material layer is patterned to be defined into individual cell units, thereby forming first pattern 70.

Figure 9B:
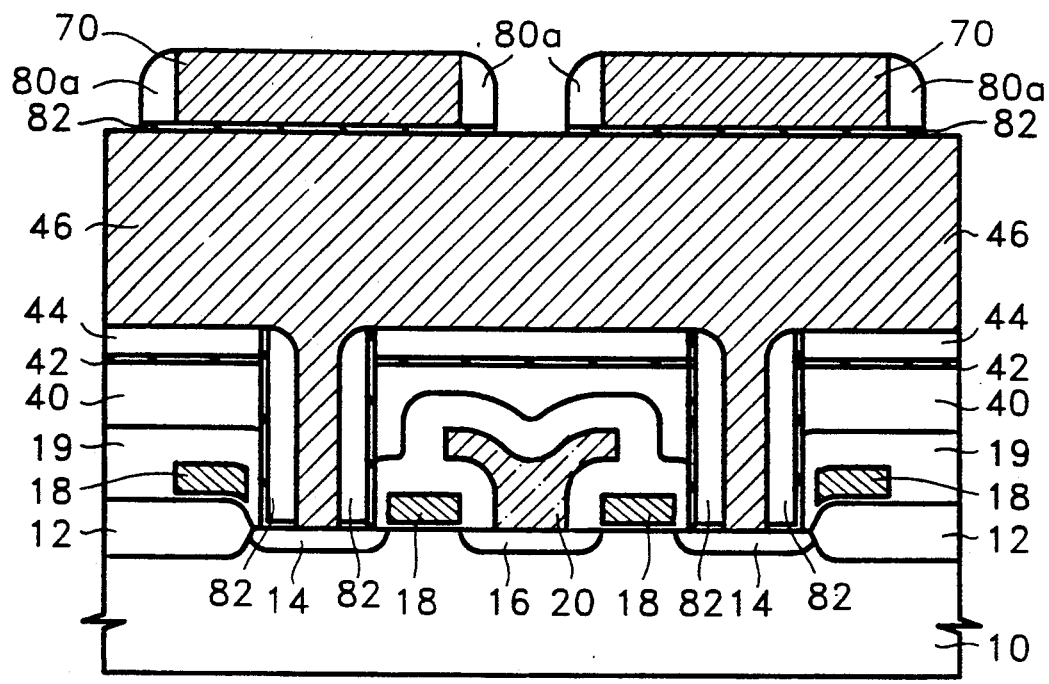

FIG. 9B illustrates a process for forming a first sidewall spacer 80a. On the whole surface of the structure whereon the first pattern has been formed, a material having an etch rate different from that of the material constituting first conductive layer 46 with respect to any anisotropic etching, e.g., an oxide or nitride, is coated to a thickness of about 500Å–1,500Å, forming the 1st second-material layer. Thereafter, anisotropic etching is carried out to form a sidewall spacer 80a on the sidewall of the first pattern. At this time, as is well-known to a person of ordinary skilled in the art, the 2nd second-material layer between the first sidewall spacer is also removed.

Figure 9C:
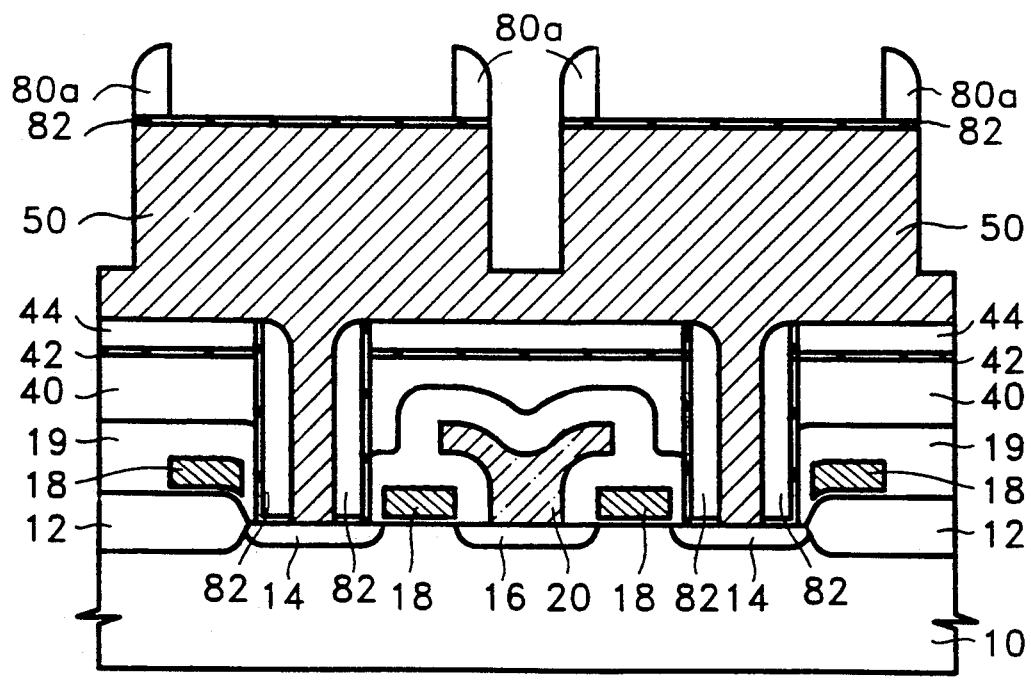

FIG. 9C illustrates a process for forming a fifth storage electrode pattern 50. An anisotropic etching is performed on the first conductive layer, using first sidewall spacer 80a as an etch-mask, so that a predetermined depth of the first conductive layer, e.g., approximately 500Å–1,500Å, is etched, thereby forming fifth storage electrode pattern 50. At this time, the first pattern is removed during the course of the etching for forming the fifth storage electrode pattern, since it has the same or a similar etch rate as that of the material constituting the first conductive layer.

Figure 9D:
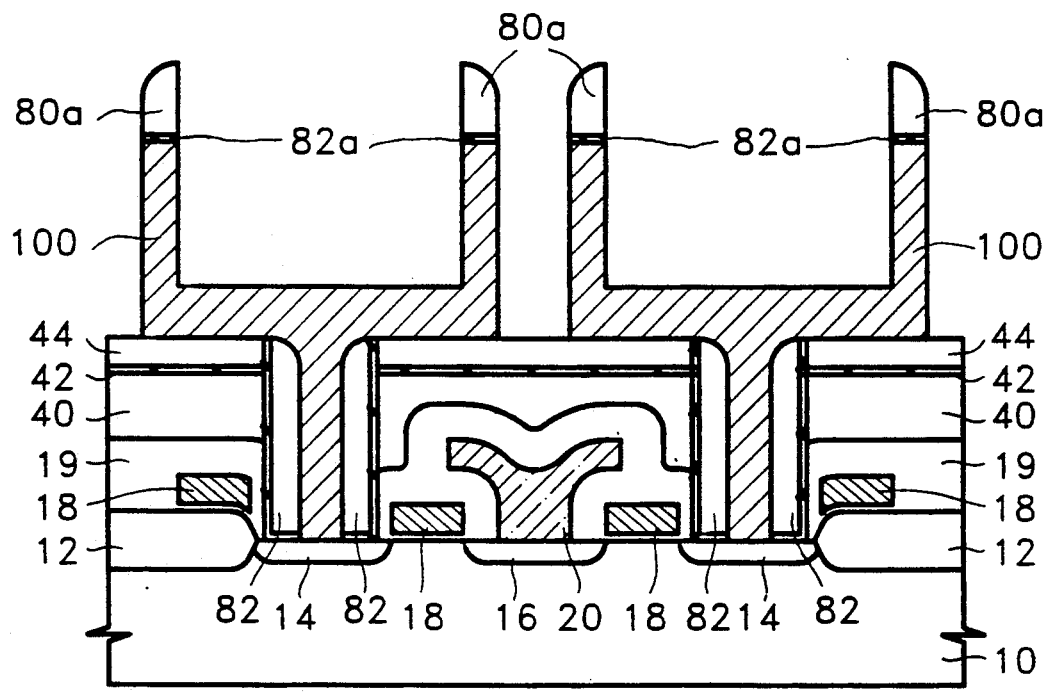

FIG. 9D illustrates a process for forming a storage electrode 100, which comprises steps of removing all of the 2nd second-material layer that remaining on the lower portion of the first sidewall spacer, and forming storage electrode 100 by performing anisotropic etching on the whole surface of the resultant structure until reaching spacer layer 44, using first sidewall spacer 80a as an etch-mask.

FIGS. 10A through 10D are sectional views showing an eighth embodiment of a method for manufacturing a semiconductor memory device according to the present invention.

Figure 10A:
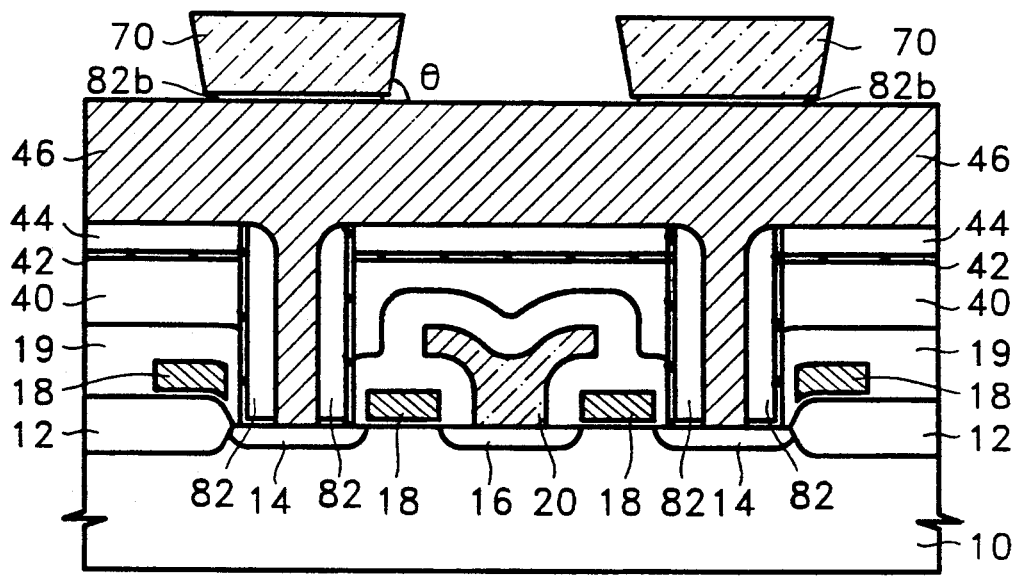
FIGS. 10A through 10D are sectional views showing an eighth embodiment of a method for manufacturing a semiconductor memory device according to the present invention.

To begin with, FIG. 10A illustrates the step of forming a pattern 82b for bar electrode formation, and first pattern 70 on the first conductive layer. After forming first pattern 70 by the method described with reference to FIG. 9A, an anisotropic or isotropic etching, or anisotropic plus isotropic etching, is performed on the 2nd second-material layer, so that the 2nd second-material layer is partially removed to leave a portion of the 2nd second-material layer formed under the first pattern, thereby forming pattern 82b for the bar electrode formation. Preferably, the 2nd second-material layer is formed to a thickness of about 200Å–1,500Å, and the inclination of the first pattern's sidewall is not to be positive ($\theta < 90°$), which is possible by over-etching the sidewall of the first pattern, using the 2nd second-material layer as an etch-blocking layer.

Figure 10B:
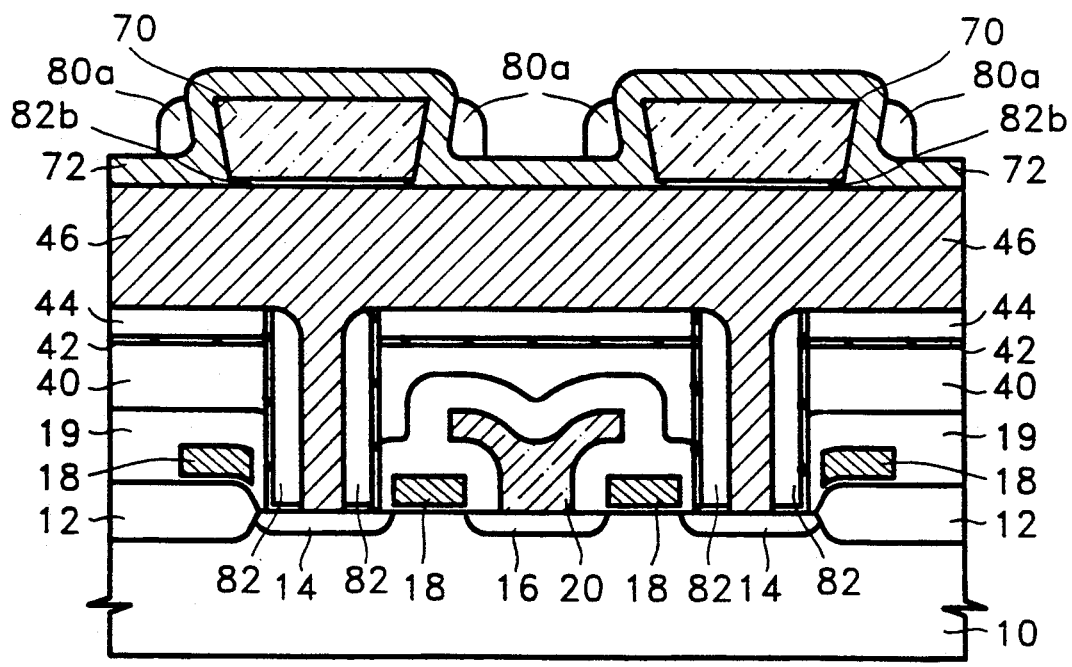

FIG. 10B illustrates the step of forming a 2nd first-material layer 72 and a first sidewall spacer 80a. A material having the same or a similar etch rate as that of the material constituting first pattern 70 and first conductive layer 46 with respect to any anisotropic positive ($\theta < 90°$), which is possible by over-etching the sidewall of the first pattern, using the 2nd second-material layer as an etch-blocking layer.

FIG. 10B illustrates the step of forming a 2nd first-material layer 72 and a first sidewall spacer 80a. A material having the same or a similar etch rate as that of the material constituting first pattern 70 and first conductive layer 46 with respect to any anisotropic etching, e.g., a polycrystalline silicon is deposited on the whole surface of the resultant structure to the thickness of about 300Å–1,500Å, thereby forming 2nd first-material layer 72. Then, first sidewall spacer 80a is formed by the same method as described with reference to FIG. 9B.

Figure 10C:
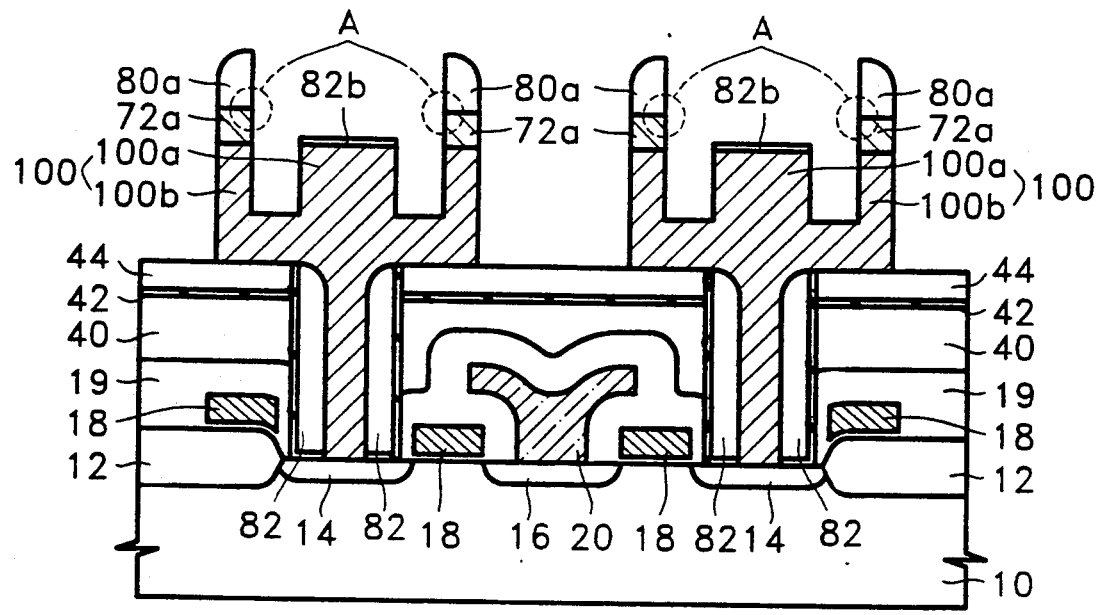

FIG. 10C illustrates a process for forming a storage electrode 100, wherein an anisotropic etching is carried out on the resultant structure having first sidewall spacer 80a thereon until reaching spacer layer 44, using 2nd first-material layer 72 as the etched object, thereby completing storage electrode 100 consisting of cylindrical electrode 100b and bar electrode 100a. At this time, as is well-known to a person of ordinary skilled in the art, since the first pattern and first conductive layer are composed of materials having the same or similar etch rates with respect to the anisotropic etching, the first pattern and first conductive layer are removed together during the anisotropic etching process, and pattern 80b inclination so as not to be positive, the formation of the fence is prevented, so that a highly reliable semiconductor memory device can be manufactured.

Figure 10D:
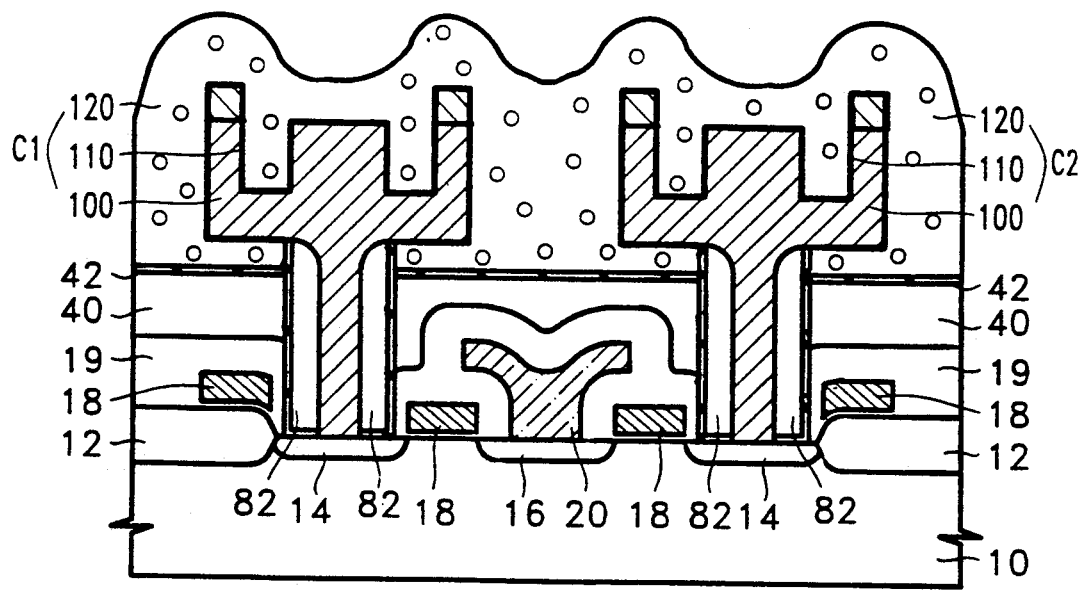

FIG. 10D illustrates a process for forming dielectric layer 110 and plate electrode 120. Here, the first sidewall spacer, the pattern for bar electrode formation, and the spacer layer are removed. (Here, 2nd first-material layer 72a remaining on the lower portion of the first sidewall spacer can be removed or unremoved, but which is left intact, and in this case, when the polycrystalline silicon is used as the 2nd first-material layer, is not removed.) Then, dielectric layer 110 is formed on the whole surface of the storage electrode, and plate electrode 120 is formed by depositing a conductive material, e.g., a polycrystalline silicon doped with an impurity, over the whole surface of the dielectric layer.

According to the eighth embodiment, single-bar electrode can be formed within the cylindrical electrode, and so as not to form the fence. Therefore, the reliability and packing density of the semiconductor memory device can also be enhanced.

FIGS. 11A through 11D are sectional views showing a ninth embodiment of a method for manufacturing a semiconductor memory device according to the present invention.

Figure 11A:
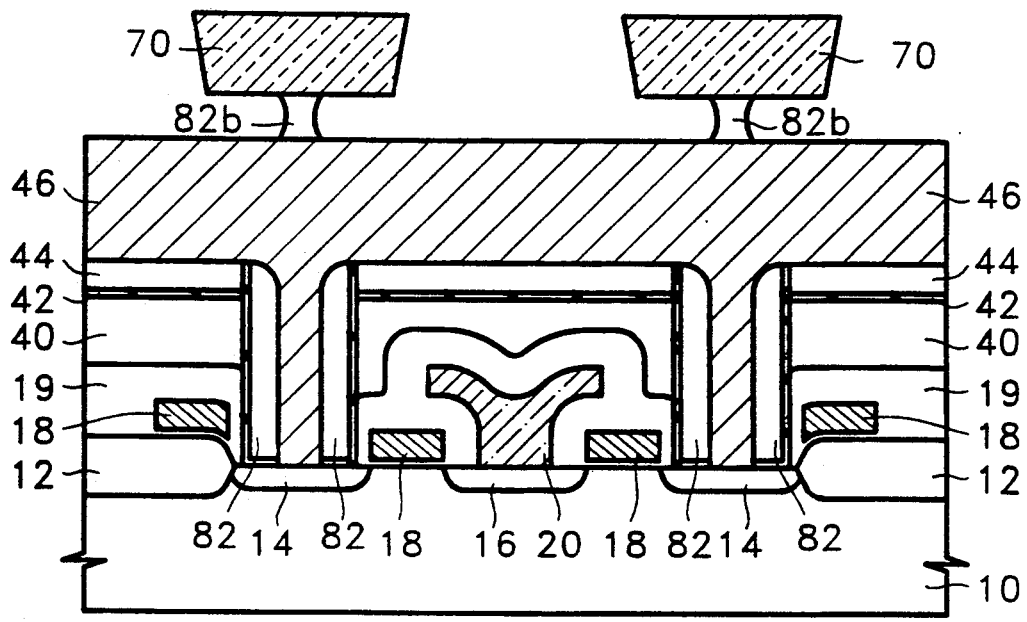
FIGS. 11A through 11D are sectional views showing a ninth embodiment of a method for manufacturing a semiconductor memory device according to the present invention.

FIG. 11A illustrates a process for forming a pattern 82b for bar electrode formation and a first pattern 70, wherein pattern 82b for bar electrode formation is formed by the same method as that described with reference to FIG. 10A, except that here the 2nd second-material layer is formed to a thickness of about 500Å–1,500Å and the only etching to form the bar electrode formation pattern that is utilized is the isotropic etching or the anisotropic plus isotropic etching.

Figure 11B:
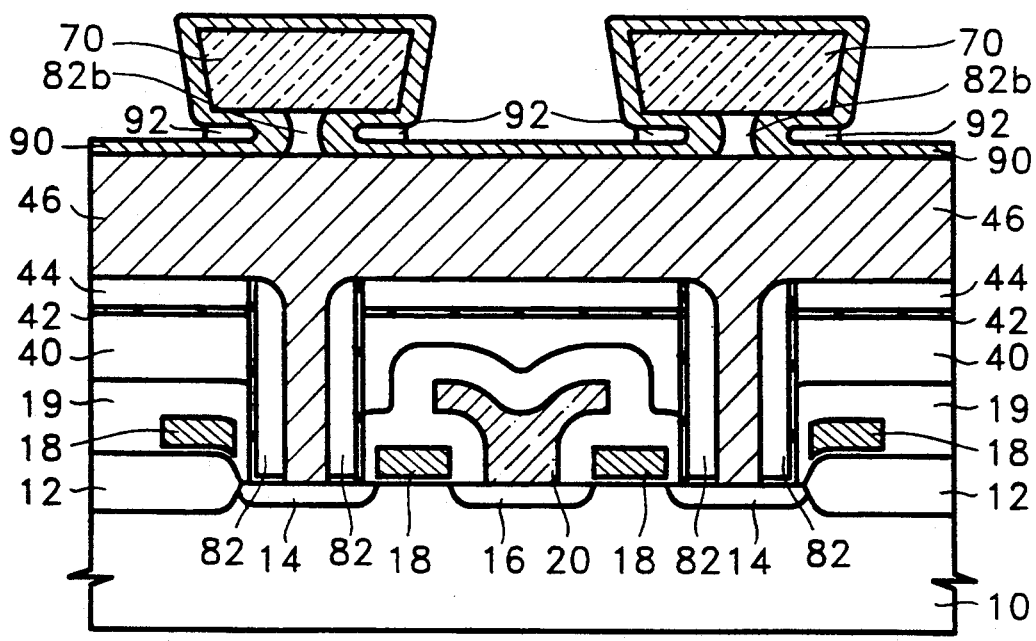

FIG. 11B illustrates a process for forming a third material layer 90 and a fourth material layer 92. Third material layer 90 is formed by coating a material whose etch rate is the same as or similar to that of the material constituting first pattern 70 and first conductive layer 46 with respect to any anisotropic etching, e.g., a polycrystalline silicon whose thickness is about 300Å–600Å. Also, the fourth material layer is formed by covering a material having an etch rate different from that of the material constituting third material layer 90 with respect to any anisotropic etching, e.g., an oxide or nitride. Then, the fourth material layer is etched to leave fourth material layer 92 only in the space under first pattern 70.

Figure 11C:
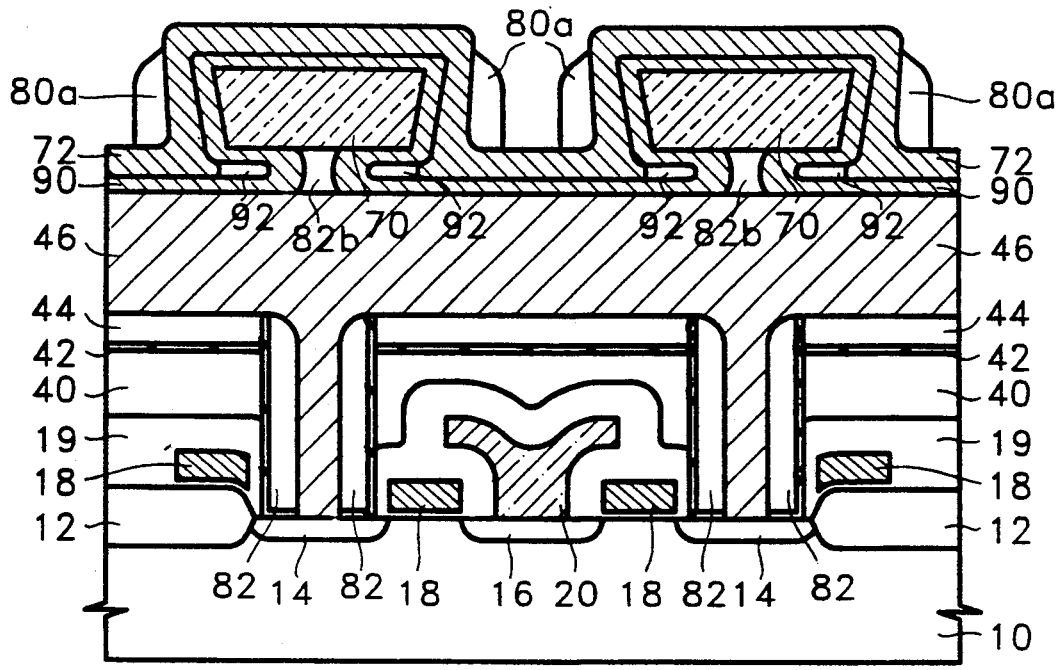

FIG. 11C illustrates the step of forming 2nd first-material layer 72 and first sidewall spacer 80a which are formed on the resultant structure by the method described with reference to FIG. 10B.

Figure 11D:
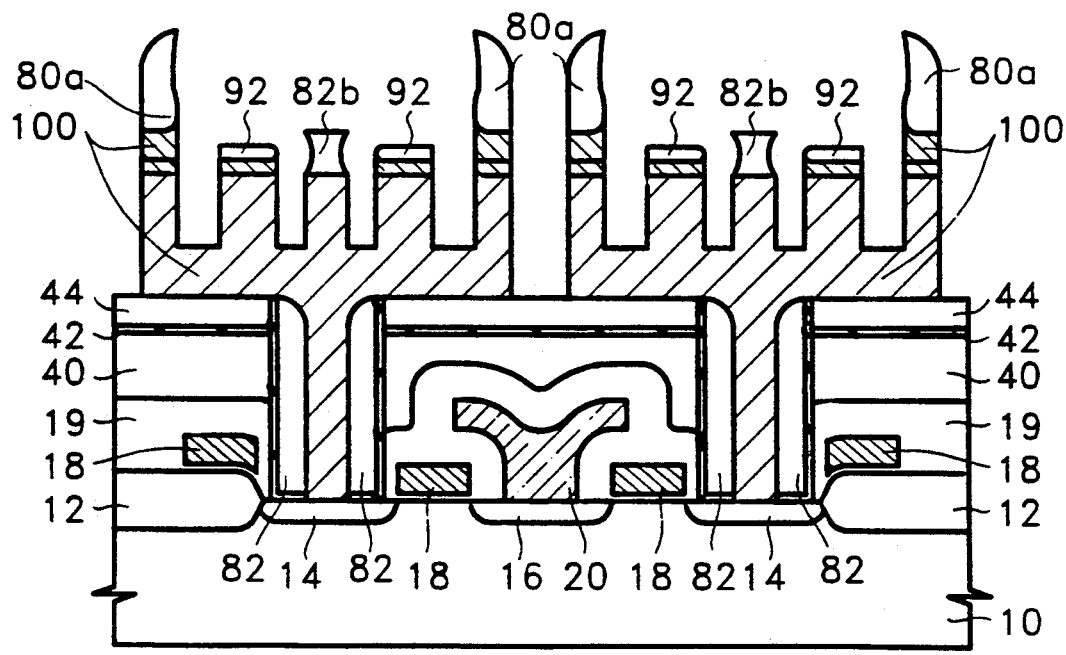

FIG. 11D illustrates the step of forming a storage electrode 100. By performing anisotropic etching on the 2nd first-material layer, not only is this layer removed, but also the third material layer, first pattern, and first conductive layer as well, completing storage electrode 100. Here, it is obvious to the person of ordinary skilled in the art that pattern 82 for forming fourth material layer 92 and the bar electrode functions as an etch-mask together with the first sidewall spacer.

According to the ninth embodiment, a storage electrode having one bar electrode within a double cylindrical electrode (multi-cylinder single-bar structure) can be obtained.

FIGS. 12A through 12E are sectional views showing a tenth embodiment of a method for manufacturing a semiconductor memory device according to the present invention.

Figure 12A:
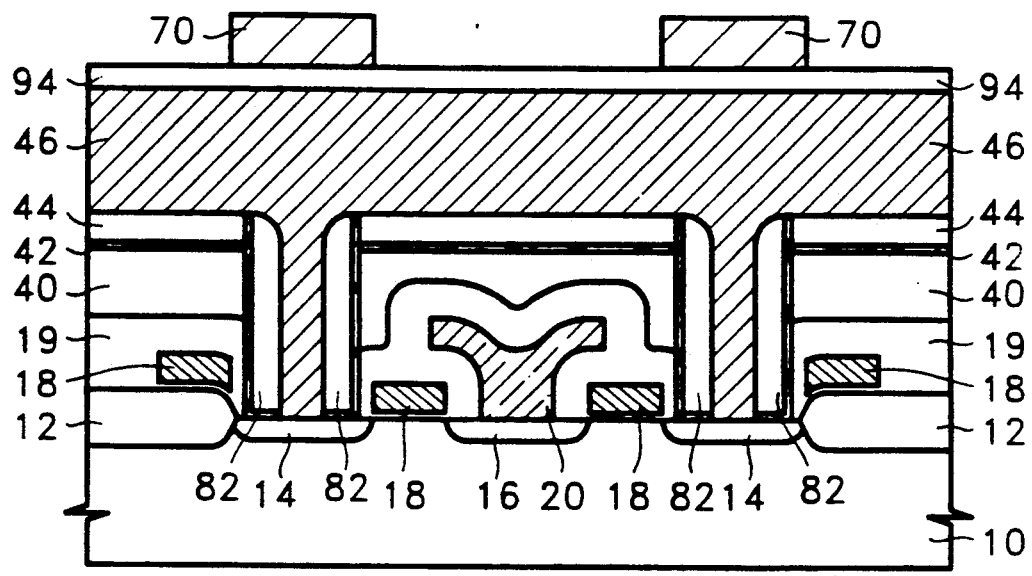
FIGS. 12A through 12E are sectional views showing a tenth embodiment of a method for manufacturing a semiconductor memory device according to the present invention.

To begin with, FIG. 12A illustrates a process for forming a 1st fifth-material layer 94 and a first pattern 70. After forming first conductive layer 46 by the method described with reference to FIGS. 3A through 3C, a material having an etch rate different from that of the material constituting the first conductive layer with respect to any anisotropic etching, e.g., an oxide or nitride, is coated on the whole surface of the resultant structure to the thickness of about 200Å–1,500Å, thereby forming 1st fifth-material layer 94. Then, a material whose etch rate is different from that of the material constituting the fifth material layer and the same as or similar to that of the material constituting the first conductive layer with respect to any anisotropic etching, is deposited to have a thickness of about 1,000Å–3,000Å. Thereafter, the deposited material is patterned to be separated into individual cell units, thereby forming a first pattern 70.

Figure 12B:
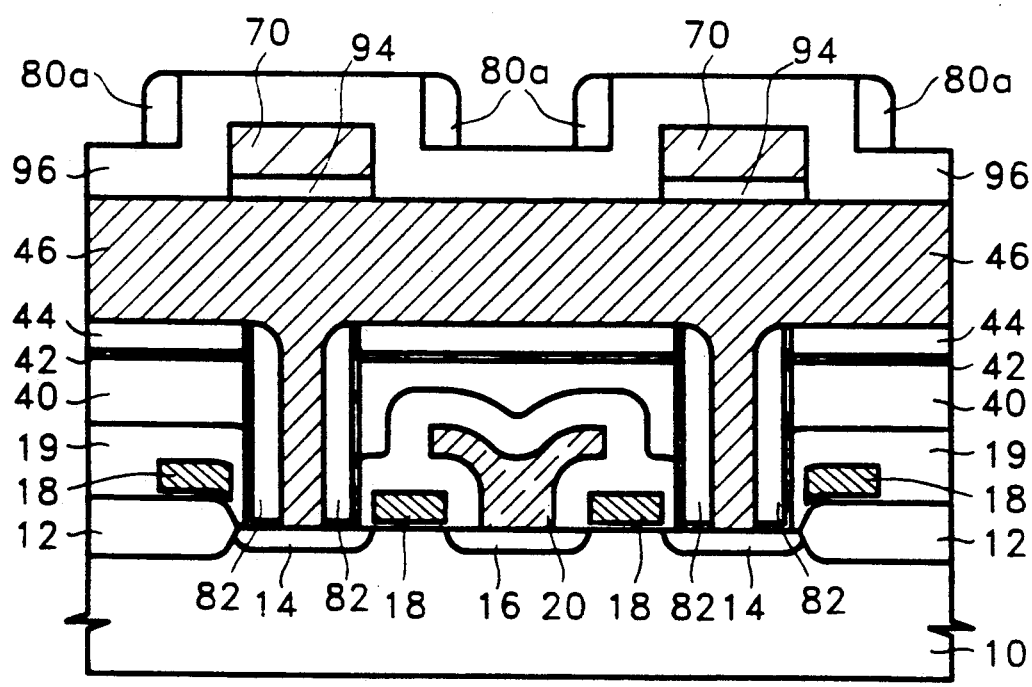

FIG. 12B illustrates the step of forming a 2nd fifth-material layer 96 and a first sidewall spacer 80a. First, the 1st fifth-material layer is etched, using first pattern 70 as an etch-mask (this step can be omitted). 2nd fifth-material layer 96 is formed by coating a material having the same or similar etch rate with that of the material constituting the 1st fifth-material layer with respect to any anisotropic etching. Thereafter, a material whose etch rate is the same as that of the material constituting first pattern 70 and first conductive layer 46 with respect to any anisotropic etching, e.g., a polycrystalline silicon, is deposited on the whole surface of the resultant structure, and then is anisotropically etched, thereby forming first sidewall spacer 80a.

Figure 12C:
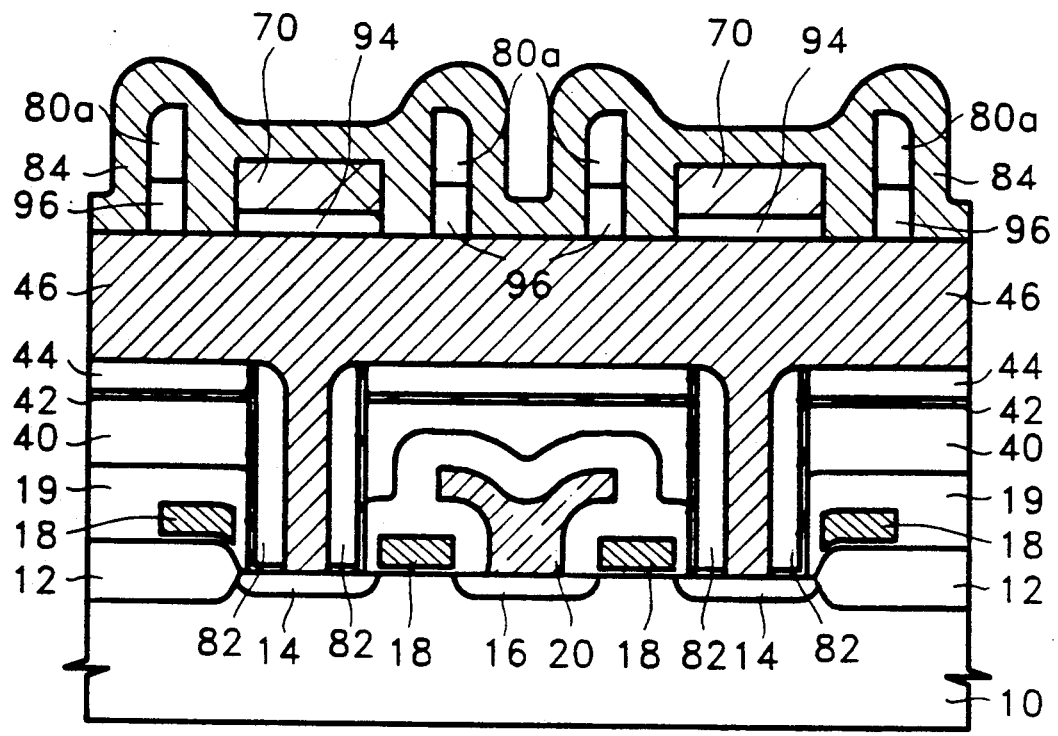

FIG. 12C illustrates the step of forming a 3rd second-material layer 84. Here, a material whose etch rate is the same as or similar to that of the material constituting first sidewall spacer 80a, first pattern 70, and first conductive layer 46 with respect to any anisotropic etching, e.g., a polycrystalline silicon, is deposited on the whole surface of the resultant structure in a thickness more than a half of 2nd fifth-material layer 96, thereby forming 3rd second-material layer 84.

Figure 12D:
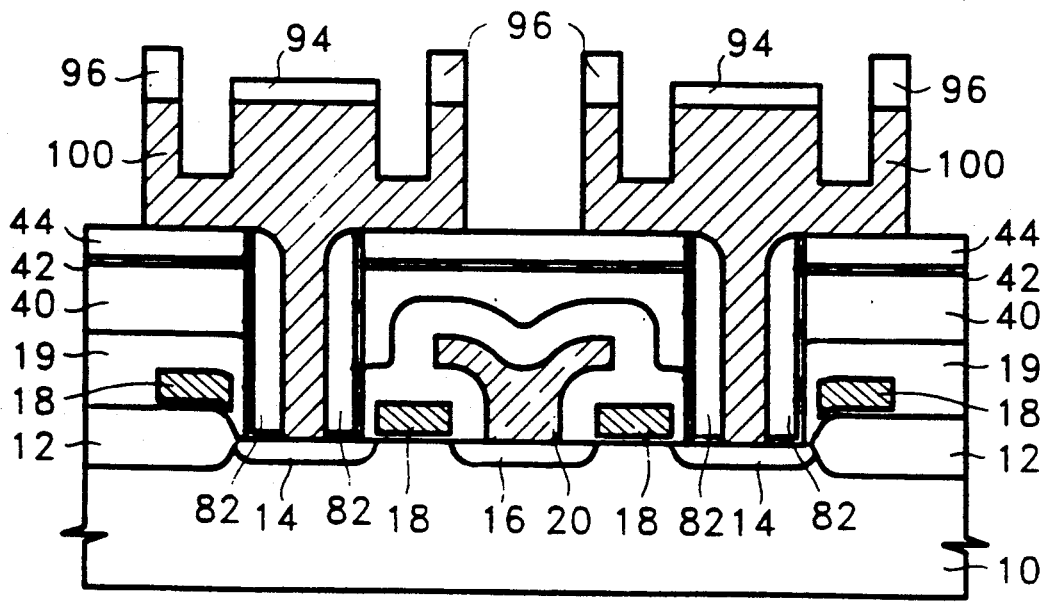

FIG. 12D illustrates the step of forming a storage electrode 100. By performing anisotropic etching on the whole surface of the resultant structure, using the 3rd second-material layer as an etched-object, since the material constituting the first sidewall spacer, first pattern and first conductive layer has the same etch rate as the material constituting the 3rd second-material layer, the first conductive layer is also etched by the anisotropic etching, so that storage electrode 100 is formed. Here, 1st fifth-material layer 94 functions as an etch-mask together with 2nd fifth-material layer 96.

Figure 12E:
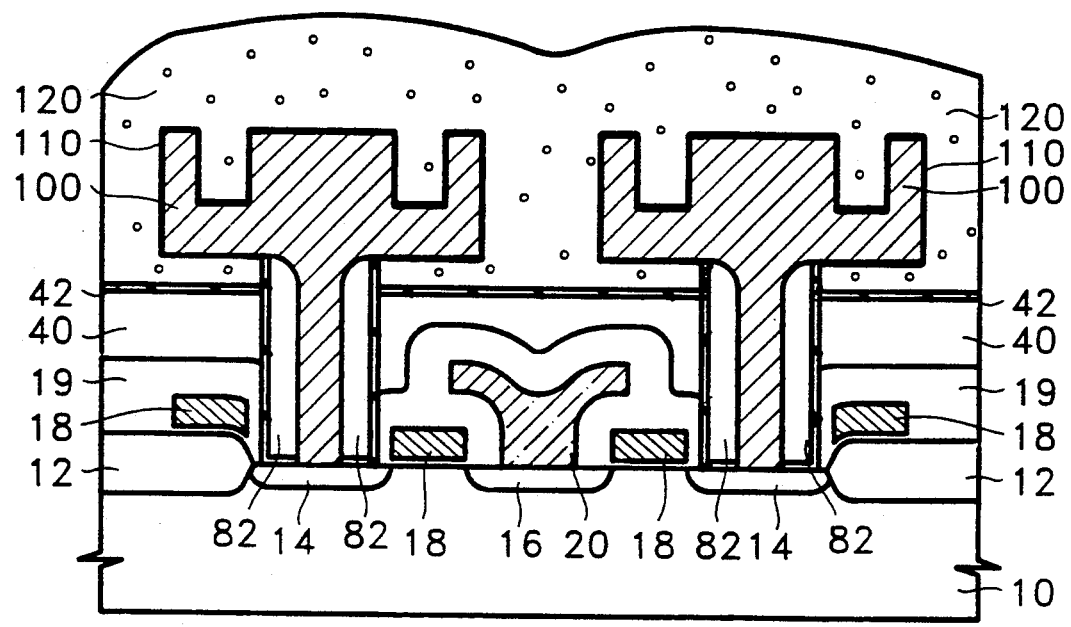

FIG. 12E illustrates a process for forming a dielectric layer 110 and a plate electrode 120. First, the 1st fifth-material layer, 2nd fifth-material layer, and spacer layer are removed. Then, a dielectric material, e.g., an ONO layer, is covered on the whole surface of storage electrode 100, forming dielectric layer 110. Thereafter, a conductive material, e.g., a polycrystalline silicon doped with an impurity, is deposited on the whole surface of the resultant structure, forming plate electrode 120.

According to the tenth embodiment, a storage electrode formed of single story (single cylinder single-bar structure) can be obtained.

FIGS. 13A through 13E are sectional views showing an eleventh embodiment of a method for manufacturing a semiconductor memory device according to the present invention.

Figure 13A:
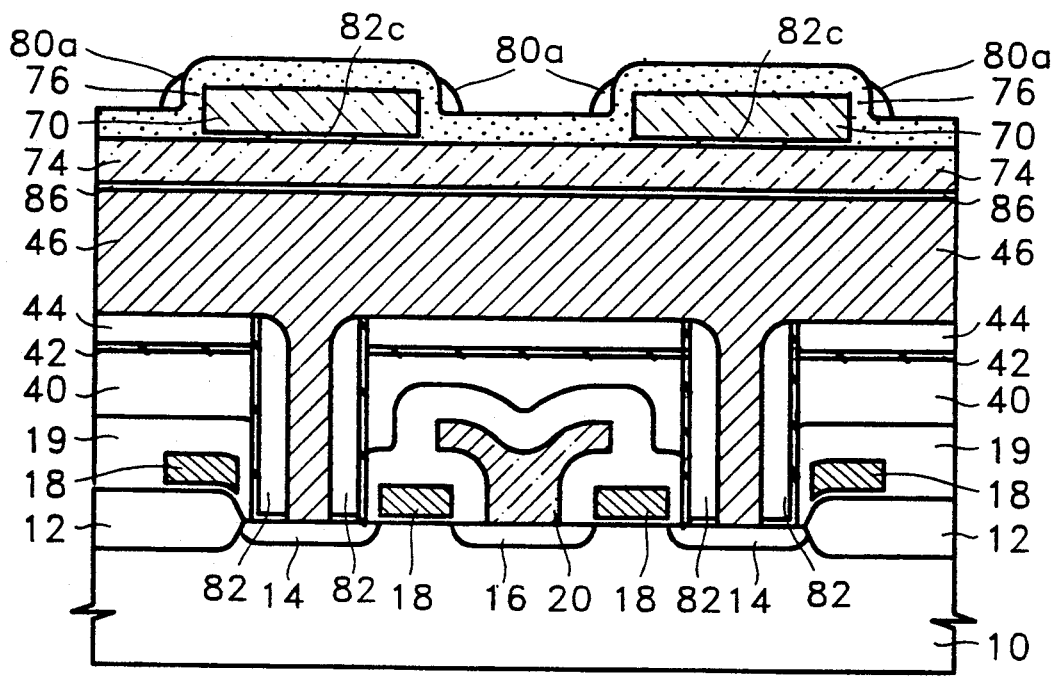
FIGS. 13A through 13E are sectional views showing an eleventh embodiment of a method for manufacturing a semiconductor memory device according to the present invention.

To begin with, in the structure illustrated in FIG. 13A, first conductive layer 46 is formed by the method described with reference to FIGS. 3A through 3C. Then, given that a material whose etch rate is the same as or similar to that of a material constituting the first conductive layer with respect to any anisotropic etching, e.g., a polycrystalline silicon, is a first material, and a material having an etch rate different from that of the first conductive material layer, e.g, an oxide or nitride, is a second material, the second material and the first material are alternately stacked twice on the whole surface of the resultant structure, so that a 4th second-material layer 86 (about 200Å–1,500Å thick), a 3rd first-material layer 74, a 2nd second-material layer (about 200Å–1,500Å thick), and a 1st first-material layer are formed. Then, the 1st first-material layer is patterned to form a first pattern 70, and a second pattern 82c is formed by etching the 2nd second-material layer, using the first pattern as an etch-mask. Thereafter, a material whose etch rate is the same as or similar to that of the first material with respect to any anisotropic etching, e.g., a polycrystalline silicon, is deposited on the whole surface of the resultant structure, thereby forming a 4th first-material layer 76. After coating a material having the same or similar etch rate with the second material with respect to any anisotropic etching, e.g., an oxide or nitride, on the whole surface of the resultant structure, anisotropic etching is performed, forming a first sidewall spacer 80a.

Figure 13B:
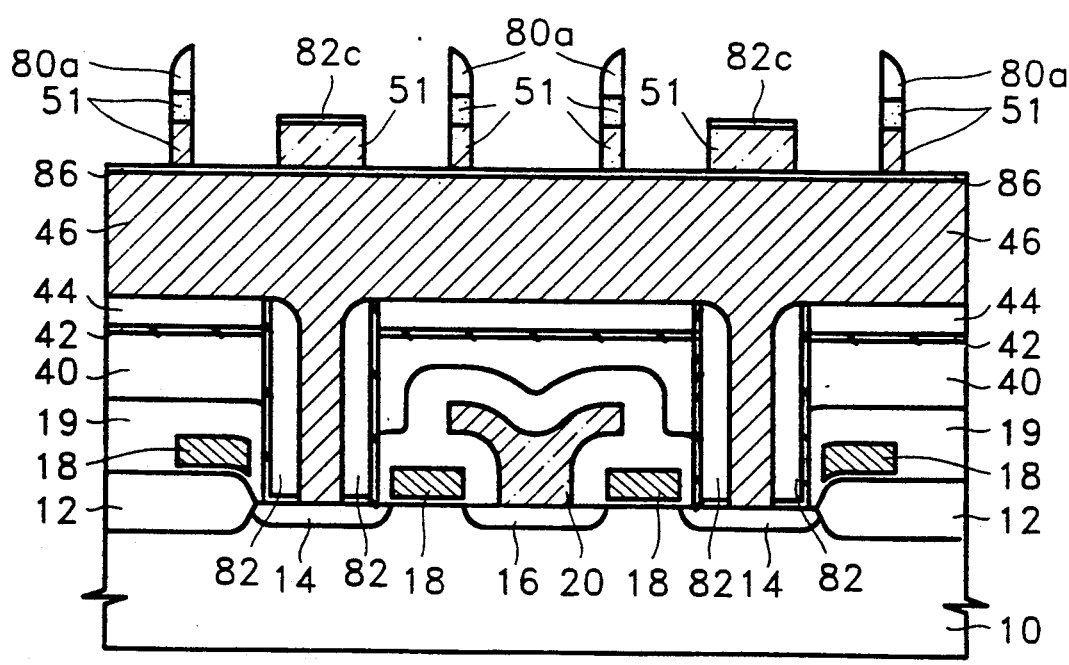

FIG. 13B illustrates the step of forming a sixth storage electrode pattern 51. When an anisotropic etching is performed on the 4th first-material layer, 6th storage electrode pattern 51 is formed by the remaining first materials stacked on the first sidewall spacer and lower portion of the second pattern. This is accomplished by the fact that the material constituting the 4th first-material layer has a same or similar etch rate with the material constituting the first pattern and 3rd first-material layer with respect to the anisotropic etching, but has a different etch rate from that of the material constituting first sidewall spacer 80a, second pattern 82c, and 4th second-material layer 86.

Figure 13C:
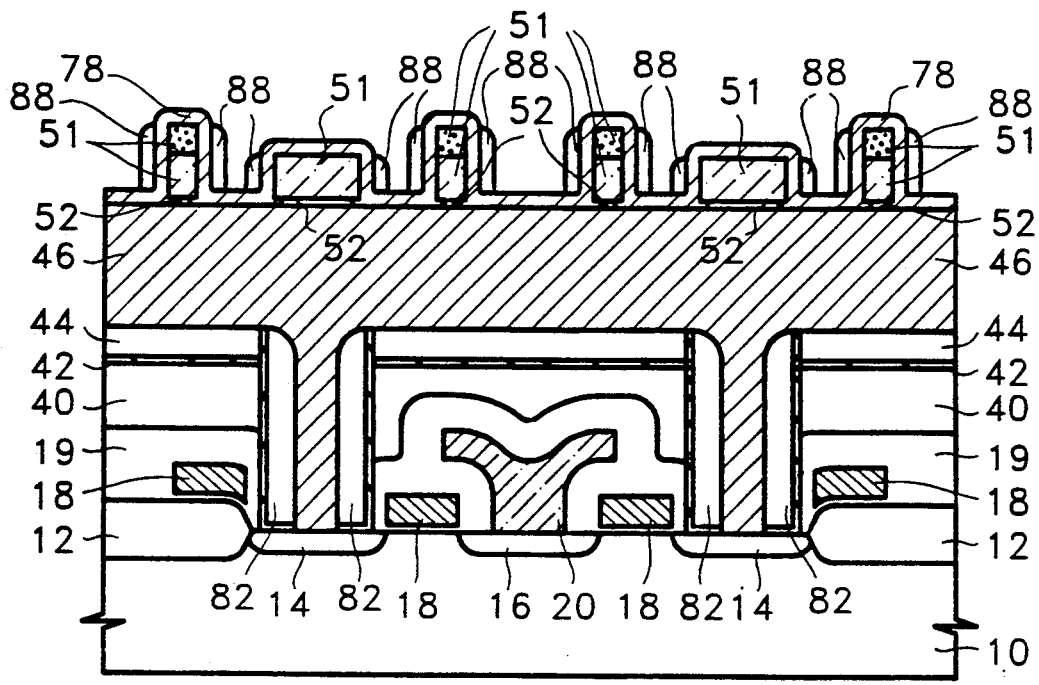

FIG. 13C illustrates the step of forming a seventh storage electrode pattern 52, a 5th first-material layer 78, and a sixth sidewall spacer 88. By etching the 4th second-material layer using sixth storage electrode pattern 51 as an etch-mask (which is the same as the method described for FIG. 10A), seventh storage electrode pattern 52 is formed on the lower portion of the sixth storage electrode pattern. A material having the same or similar etch rate with that of the materials constituting the sixth storage electrode pattern 51 with respect to any anisotropic etching, is deposited to form 5th first-material layer 78. Then, a material whose etch rate is different from that of the material constituting the 5th first-material layer with respect to any anisotropic etching, e.g., an oxide or nitride, is coated on the whole surface of the resultant structure, thereby forming the 5th second-material layer. Sixth sidewall spacer 88 is formed by anisotropically etching of the 5th second-material layer.

Figure 13D:
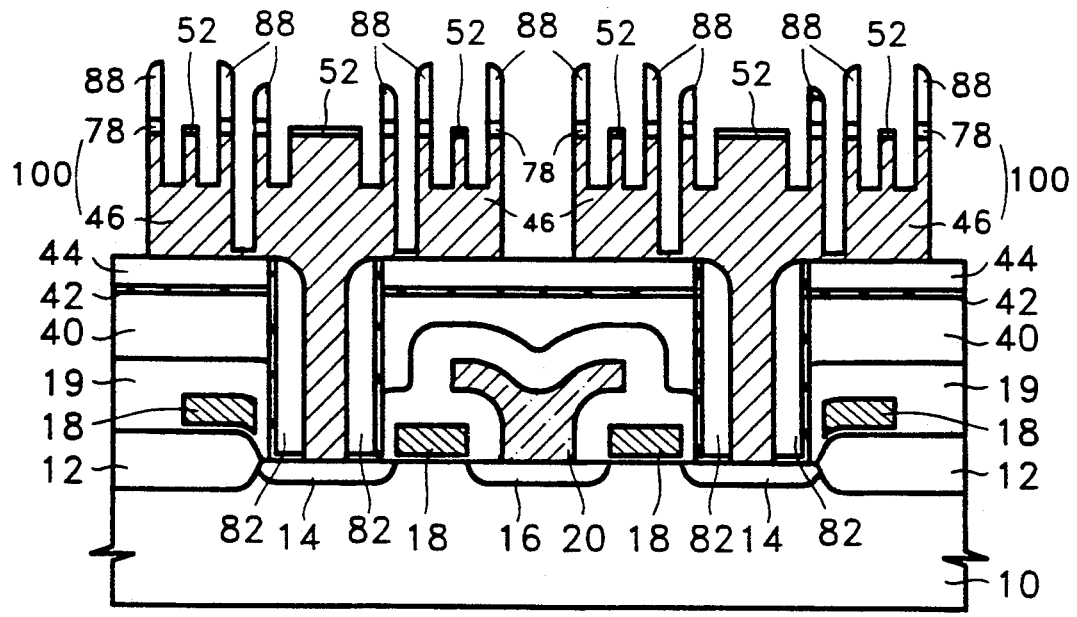

FIG. 13D illustrates the step of forming a storage electrode 100. By performing an anisotropic etching on the whole surface of the resultant structure, using sixth sidewall spacer 88 as an etch-mask and 5th first-material layer 78 as the etched-object, the sixth storage electrode pattern and first conductive layer are also removed by the anisotropic etching, thereby forming storage electrode 100. This is because, the material constituting 5th first-material layer 78 has the same or similar etch rate with the material constituting first conductive layer 46 and sixth storage electrode pattern 51 with respect to the anisotropic etching, and has different etch rate from that of the material constituting sixth sidewall spacer 88 and sixth storage electrode pattern 52. Here, seventh storage electrode pattern 52 functions as an etch-mask together with sixth sidewall spacer 88.

Figure 13E:
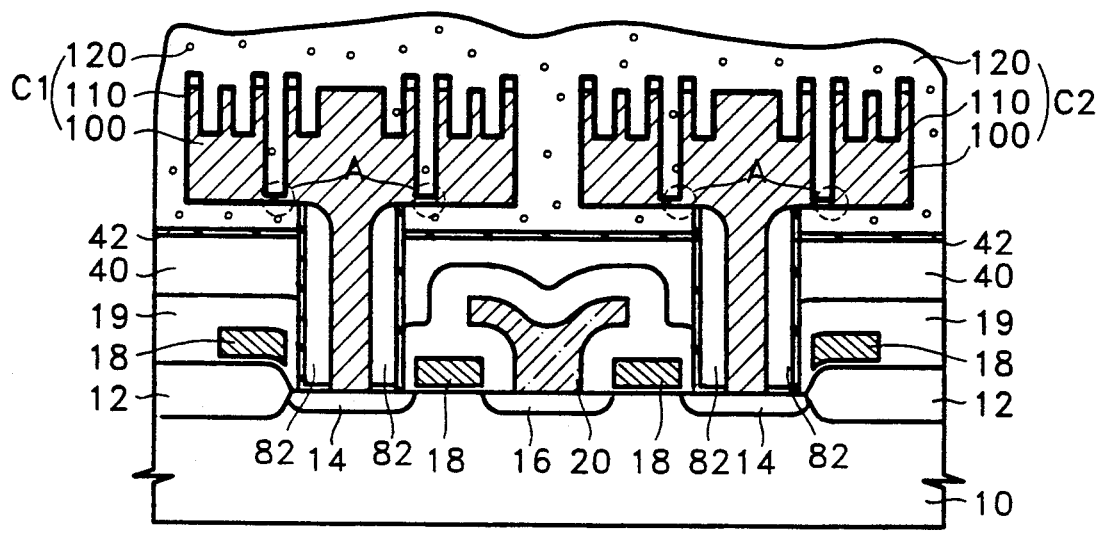

FIG. 13E illustrates a process for forming a dielectric layer 110 and a plate electrode 120. After removing the sixth sidewall spacer, spacer layer, and seventh storage electrode pattern, dielectric layer 110 and plate electrode 120 are formed on the whole surface of the resultant structure by the same method described with reference to FIG. 12E.

According to the eleventh embodiment, a storage electrode having one bar electrode with quadruple cylindrical electrode (multi-cylinder single-bar structure) can be obtained.

Figure 14A:
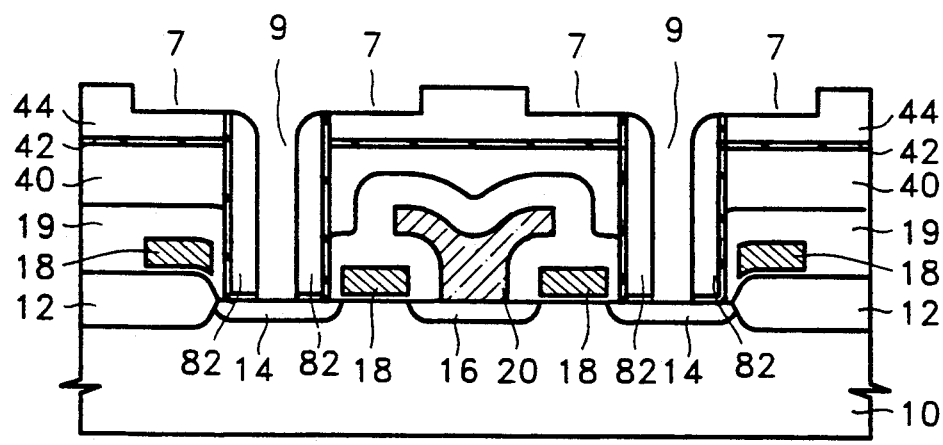
FIGS. 14A and 14B are sectional views showing a twelfth embodiment of a method for manufacturing a semiconductor memory device according to the present invention.
Figure 14B:
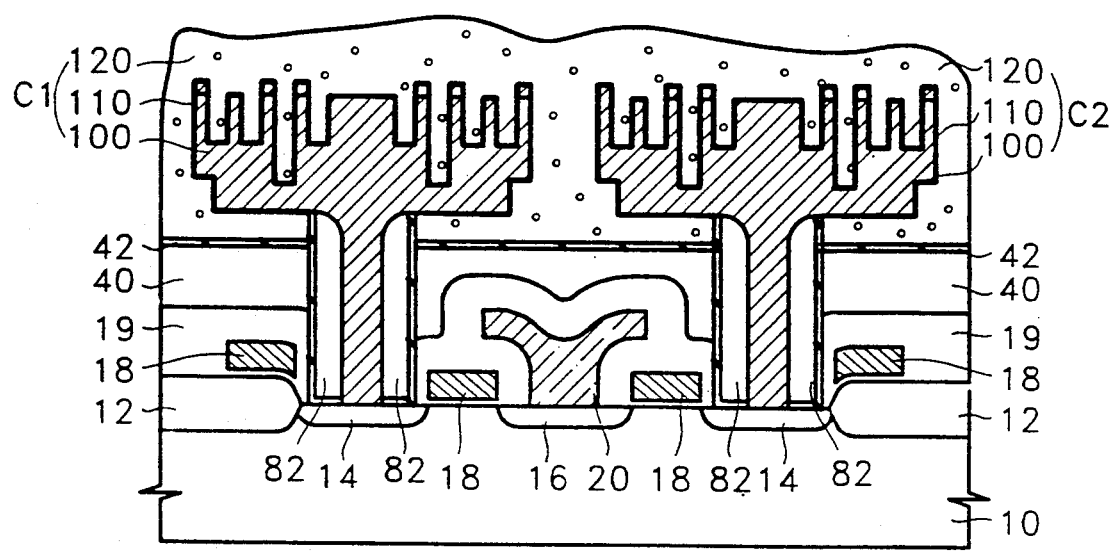

FIGS. 14A and 14B are sectional views showing a twelfth embodiment of a method for manufacturing a semiconductor device according to the present invention. After forming a groove 7 whose two-dimensional size is smaller than the storage electrode in the spacer layer (or an insulating material layer) where the storage electrode will be formed (FIG. 14A), the storage electrode is formed, and then the spacer layer (or an insulating material layer) is removed.

According to the twelfth embodiment, a storage electrode 100 which has no weak portion A (as designated in FIG. 13E) can be obtained.

The oxide used in the above embodiments is any one among a high temperature oxide layer, a plasma-enhanced tetra-ethyl-ortho-silicate (PE-TEOS) oxide layer, and a silane oxide layer, and a silicon nitride is used as the nitride. Also, the sidewall of every storage electrode is preferably formed so as not to be negatively inclined.

Accordingly, the present invention is favorable to achieve high packing density of a semiconductor memory device by storage electrodes of several structures such as a single-cylinder and single-bar electrode structure, a single-cylinder and multiple bar electrode structure, a multiple cylinder and single bar electrode structure, and a multiple cylinder and multiple bar electrode structure. Further, occurrence of a fence can be prevented, and the storage electrode can be formed of a single story, so that a highly reliable semiconductor memory device can be manufactured.

It will be apparent that many modifications and variations could be effected easily by one skilled in the art without departing from the spirit or scope of the novel concepts of the present invention.

What is claimed is:

1. A method for manufacturing a semiconductor memory device including a process for manufacturing a capacitor comprising the steps of:
    forming a first conductive layer on a semiconductor substrate;
    forming a first pattern composed of a 1st first-material layer on said first conductive layer;
    etching said first conductive layer, using said first pattern composed of said 1st first-material layer as an etch-mask;
    removing said first pattern composed of said 1st first-material layer;
    forming a first sidewall spacer composed of 1st second-material layer on the resultant structure; and
    etching the material layer under said first sidewall spacer, using said first sidewall spacer as an etch-mask.

2. A method for manufacturing a semiconductor memory device as claimed in claim 1, further comprising a step of stacking an etch-blocking layer and a spacer layer on the whole surface of said semiconductor substrate, before said step of forming said first conductive layer.

3. A method for manufacturing a semiconductor memory device as claimed in claim 2, further comprising a step of forming a planarizing layer with a planarized surface on the whole surface of said semiconductor substrate, before said step of stacking said etch-blocking and spacer layers.

4. A method for manufacturing a semiconductor memory device as claimed in claim 2, said spacer layer is removed prior to forming a dielectric layer.

5. A method for manufacturing a semiconductor memory device as claimed in claim 1, wherein said material layer formed on the lower portion of said first sidewall spacer is said first conductive layer.

6. A method for manufacturing a semiconductor memory device as claimed in claim 5, wherein said step of etching said first conductive layer using said sidewall spacer as an etch-mask is carried out when said first pattern composed of said 1st first-material layer is removed or left intact.

7. A method for manufacturing a semiconductor memory device as claimed in claim 6, when said first conductive layer is etched while leaving intact said first pattern composed of said 1st first-material layer, further comprising the steps of:
    removing said first pattern composed of said 1st first-material layer, after defining said first conductive layer into individual cell units by etching said first conductive layer when said first pattern composed of said 1st first-material layer is left intact; and
    etching said first conductive layer, using said first sidewall spacer as an etch-mask.

8. A method for manufacturing a semiconductor memory device as claimed in claim 6, when said first conductive layer is etched while leaving intact said first pattern composed of said 1st first-material layer, further comprising the steps of:

removing said first pattern composed of said 1st first-material layer, after etching said first conductive layer when said first pattern composed of said 1st-first material layer is left intact;

forming a first storage electrode pattern by etching said first conductive layer, using said first sidewall spacer as an etch-mask;

removing said first sidewall spacer;

forming a second sidewall spacer on the sidewall of said first storage electrode pattern; and etching said first conductive layer using said second sidewall spacer as an etch-mask.

9. A method for manufacturing a semiconductor memory device as claimed in claim 6, when said first conductive layer is etched while removing said first pattern composed of said 1st first-material layer, further comprising the steps of:

forming a second storage electrode pattern by etching said first conductive layer, using said first sidewall spacer as an etch-mask;

removing said first sidewall spacer;

forming a third sidewall spacer on the sidewall of said 2nd storage electrode pattern; and etching said first conductive layer, using said third sidewall spacer as an etch-mask.

10. A method for manufacturing a semiconductor memory device as claimed in claim 1, after forming a third storage electrode pattern by etching said first conductive layer using said first sidewall spacer as an etch-mask, further comprising the steps of:

removing materials remaining on said third storage electrode pattern;

forming a fourth sidewall spacer on the sidewall of said third storage electrode pattern; and etching said first conductive layer, using said fourth sidewall spacer as an etch-mask.

11. A method for manufacturing a semiconductor memory device as claimed in claim 10, after forming a fourth storage electrode pattern by etching said first conductive layer using said fourth sidewall spacer as an etch-mask, further comprising the steps of:

forming a fifth sidewall spacer on the sidewall of said fourth storage electrode pattern; and etching said first conductive layer, using said fifth sidewall spacer as an etch-mask.

12. A method for manufacturing a semiconductor memory device as claimed in claim 1, wherein a material which has an etch rate different from that of a material constituting said conductive layer with respect to any anisotropic etching, is used as the material constituting said first spacer and said 1st first-material layer.

13. A method for manufacturing a semiconductor memory device as claimed in claim 12, wherein a polycrystalline silicon doped with an impurity is used as said material constituting said first conductive layer, a photoresist is used as said first material, and an oxide or nitride is used as said material constituting said first spacer.

14. A method for manufacturing a semiconductor memory device as claimed in any one of claims 7 to 11, wherein the layers are etched to a depth of approximately 500 Å–1,500 Å.

15. A method for manufacturing a semiconductor memory device as claimed in claim 1, wherein said first material is a material having the same etch rate as said material constituting said first conductive layer with respect to any anisotropic etching.

16. A method for manufacturing a semiconductor memory device as claimed in claim 15, further comprising, before forming said first pattern composed of said 1st first-material layer, the step of forming a 2nd second-material layer on said first conductive layer by depositing said second material which has an etch rate different from that of said material constituting said 1st first-material layer with respect to any anisotropic etching.

17. A method for manufacturing a semiconductor memory device as claimed in claim 16, further comprising, after forming said first pattern composed of said 1st-first material layer, the steps of:

forming a pattern composed of said 2nd second-material layer, for bar electrode formation, by etching said 2nd second-material layer, using said first pattern composed of said 1st first-material layer; and forming a 2nd first-material layer by repeating the deposition of said first material on the whole surface of the resultant structure, whereby said pattern for bar electrode formation also functions as an etch-mask when etching said material layer formed under said first sidewall spacer, using said first sidewall spacer as an etch-mask.

18. A method for manufacturing a semiconductor memory device as claimed in claim 17, wherein said first conductive layer is formed to a thickness of approximately 3,000Å to 6,000Å, said 2nd second-material layer is approximately 200Å–1,500Å, said first pattern composed of said 1st first-material layer is approximately 1,000Å–3,000Å, said 2nd first-material layer is approximately 500Å–1,500Å, and said 1st second-material layer for forming said first sidewalls is approximately 500Å–1,500Å.

19. A method for manufacturing a semiconductor memory device as claimed in claim 17, wherein said step of forming said pattern of said 2nd second-material for bar electrode formation by etching said 2nd second-material layer is carried out by any one of anisotropic etching, isotropic etching, and anisotropic etching plus isotropic etching, which use said first pattern composed of said 1st first-material layer as an etch-mask.

20. A method for manufacturing a semiconductor memory device as claimed in claim 19, when isotropic etching or anisotropic etching plus isotropic etching is performed for forming said pattern for bar electrode formation, further comprising:

a first step of stacking a third material layer and a fourth material layer on the whole surface of the resultant structure, after performing said isotropic etching or anisotropic plus isotropic etching; and a second step of etching said fourth material layer to leave a portion of said fourth material layer under said pattern for bar electrode formation.

21. A method for manufacturing a semiconductor memory device as claimed in claim 20, wherein a material constituting said third material layer has a different etch rate from that of said second material, and the same or similar etch rate with that of said first material with respect to any anisotropic etching; and a material constituting said fourth material layer has a different etch rate from that of said material constituting said third material layer, and the same or a similar etch rate as that of said second material with respect to any anisotropic etching.

22. A method for manufacturing a semiconductor memory device as claimed in claim 20, wherein said first and second steps are carried out at least once, after said step of forming said pattern for bar electrode formation.

23. A method for manufacturing a semiconductor memory device as claimed in claim 20, wherein said 2nd second-material layer is formed to a thickness of about 500Å–1,500Å, and said third material layer is about 300Å–600Å.

24. A method for manufacturing a semiconductor memory device as claimed in claim 1, wherein the sidewall of said first pattern composed of said 1st first-material layer is formed to have an inclination which is not negative with respect to the horizontal surface.

25. A method for manufacturing a semiconductor memory device as claimed in claim 15, further comprising, before said step of forming said first pattern composed of said 1st first-material layer, a step of forming a 1st fifth-material layer consisting of a material whose etch rate is different from that of said material constituting said first conductive layer with respect to any anisotropic etching.

26. A method for manufacturing a semiconductor memory device as claimed in claim 25, wherein a step of repeating formation of a 2nd fifth-material on a whole surface of the resultant structure is added after said step of forming said first pattern composed of said 1st first-material layer; said step of etching said material layer formed under said first sidewall spacer using said first sidewall spacer composed of said 1st second-material layer as an etch-mask is replaced with a step of performing an anisotropic etching on the whole surface of the resultant structure until reaching a surface of said first conductive layer, using said first sidewall spacer and first pattern composed of said 1st first-material layer as etch-masks; and then a step of forming a 3rd second-material, and a step of performing an anisotropic etching on said 3rd second-material layer, first sidewall spacer, first pattern and first conductive layer, using said 1st and 2nd-fifth material layer remaining under said first sidewall spacer as etch-masks, are added.

27. A method for manufacturing a semiconductor memory device as claimed in claim 25, further comprising, after said step of forming said first pattern composed of said 1st first-material layer, a step of anisotropic etching of said fifth material layer, using said first pattern composed of said 1st first-material layer as an etch-mask.

28. a method for manufacturing a semiconductor memory device as claimed in claim 26, wherein a polycrystalline silicon doped with an impurity is used as said first conductive layer, a polycrystalline silicon is used as said first and second materials, and an oxide or nitride is used as a material constituting said fifth material layer.

29. A method for manufacturing a semiconductor memory device as claimed in claim 16, further comprising the steps of:

stacking a 4th second-material layer composed of said second material and a 3rd first-material layer composed of said first material on said first conductive layer, before said step of forming said 2nd second-material layer;

forming a second pattern composed of said 2nd second-material layer by etching said 2nd second-material layer, using said first pattern as an etch-mask, and forming 4th first-material layer by repeating the deposition of said first material on the whole surface of the resultant structure, after said step of forming said first pattern composed of said 1st first-material layer;

etching said material layer formed under said first sidewall spacer, using said first sidewall spacer composed of said 1st second-material layer as an etch-mask;

forming a fifth storage electrode pattern by anisotropically etching of said 4th first-material layer and 3rd first-material layer, using said first sidewall spacer and second pattern composed of said 2nd second-material layer as etch-masks;

forming a sixth storage electrode pattern composed of said 4th second-material layer by etching said 4th second-material layer, using said fifth storage electrode pattern as an etch-mask, and, at the same time, removing said first sidewall spacer and second pattern;

forming a 5th first-material layer and a 5th second-material layer by sequentially stacking said first and second materials on the whole surface of the resultant structure;

forming a 6th sidewall spacer composed of said 5th second-material layer by anisotropically etching of said 5th second-material layer; and anisotropically etching of said 5th first-material layer, fifth storage electrode pattern, and first conductive layer, using said sixth sidewall spacer and sixth storage electrode pattern as etch-masks.

30. A method for manufacturing a semiconductor memory device as claimed in claim 29, wherein said first and second patterns are formed to have an inclination whose sidewall is not positive with respect to the horizontal surface.

31. A method for manufacturing a semiconductor memory device as claimed in any one of claims 2 and 3, wherein a groove is formed in said spacer layer of each cell, to be isolated from each other and defined as individual cell units.

32. A method for manufacturing a semiconductor memory device as claimed in claim 12, wherein a polycrystalline silicon doped with an impurity is used as said material constituting said first conductive layer, an oxide or nitride is used as said material constituting said 1st first-material layer, and an oxide or nitride is used as said material constituting said first to fifth sidewall spacers.

33. A method for manufacturing a semiconductor memory device as claimed in claim 32, wherein, after forming said first pattern composed of said 1st first-material layer, a material having the same etch rate as said material constituting said first conductive layer with respect to any anisotropic etching is again deposited on the resultant structure.

* * * * *